(12) United States Patent
Ando et al.

(10) Patent No.: US 11,081,275 B2
(45) Date of Patent: Aug. 3, 2021

(54) ELECTRONIC DEVICE

(71) Applicant: TDK CORPORATION, Tokyo (JP)

(72) Inventors: Norihisa Ando, Tokyo (JP); Sunao Masuda, Tokyo (JP); Masahiro Mori, Tokyo (JP); Kayou Matsunaga, Tokyo (JP); Kosuke Yazawa, Tokyo (JP); Jin Murakami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 69 days.

(21) Appl. No.: 16/414,873

(22) Filed: May 17, 2019

(65) Prior Publication Data
US 2020/0043652 A1 Feb. 6, 2020

(30) Foreign Application Priority Data

Jul. 31, 2018 (JP) .............................. JP2018-144530

(51) Int. Cl.
| | |
|---|---|
| *H01G 2/06* | (2006.01) |
| *H01G 4/38* | (2006.01) |
| *H01G 4/12* | (2006.01) |
| *H01G 4/228* | (2006.01) |

(52) U.S. Cl.
CPC ............... *H01G 2/065* (2013.01); *H01G 4/12* (2013.01); *H01G 4/228* (2013.01); *H01G 4/38* (2013.01)

(58) Field of Classification Search
CPC ........ H01G 4/232; H01G 4/248; H01G 4/236; H01G 4/38; H01G 2/065; H01G 4/12
USPC ............ 361/306.3, 321.1, 321.2, 321.3, 328, 361/301.4
See application file for complete search history.

(56) References Cited

U.S. PATENT DOCUMENTS

| | | | |
|---|---|---|---|
| 2014/0160624 A1* | 6/2014 | McConnell | ............... H01G 4/38 361/301.4 |
| 2015/0131202 A1* | 5/2015 | Masuda | ................... H01G 2/06 361/301.4 |
| 2018/0211784 A1 | 7/2018 | Ando et al. | |

FOREIGN PATENT DOCUMENTS

| | | |
|---|---|---|
| CN | 204263239 U | 4/2015 |
| JP | 2000-235931 A | 8/2000 |

\* cited by examiner

*Primary Examiner* — Arun Ramaswamy
(74) *Attorney, Agent, or Firm* — Oliff PLC

(57) ABSTRACT

An electronic device includes a plurality of chip components, an intermediate metal terminal, and an outer metal terminal. The intermediate metal terminal connects end surfaces of terminal electrodes of the chip components. The outer metal terminal is connectable to the terminal electrode positioned opposite to the terminal electrode connectable to the intermediate metal terminal.

19 Claims, 15 Drawing Sheets

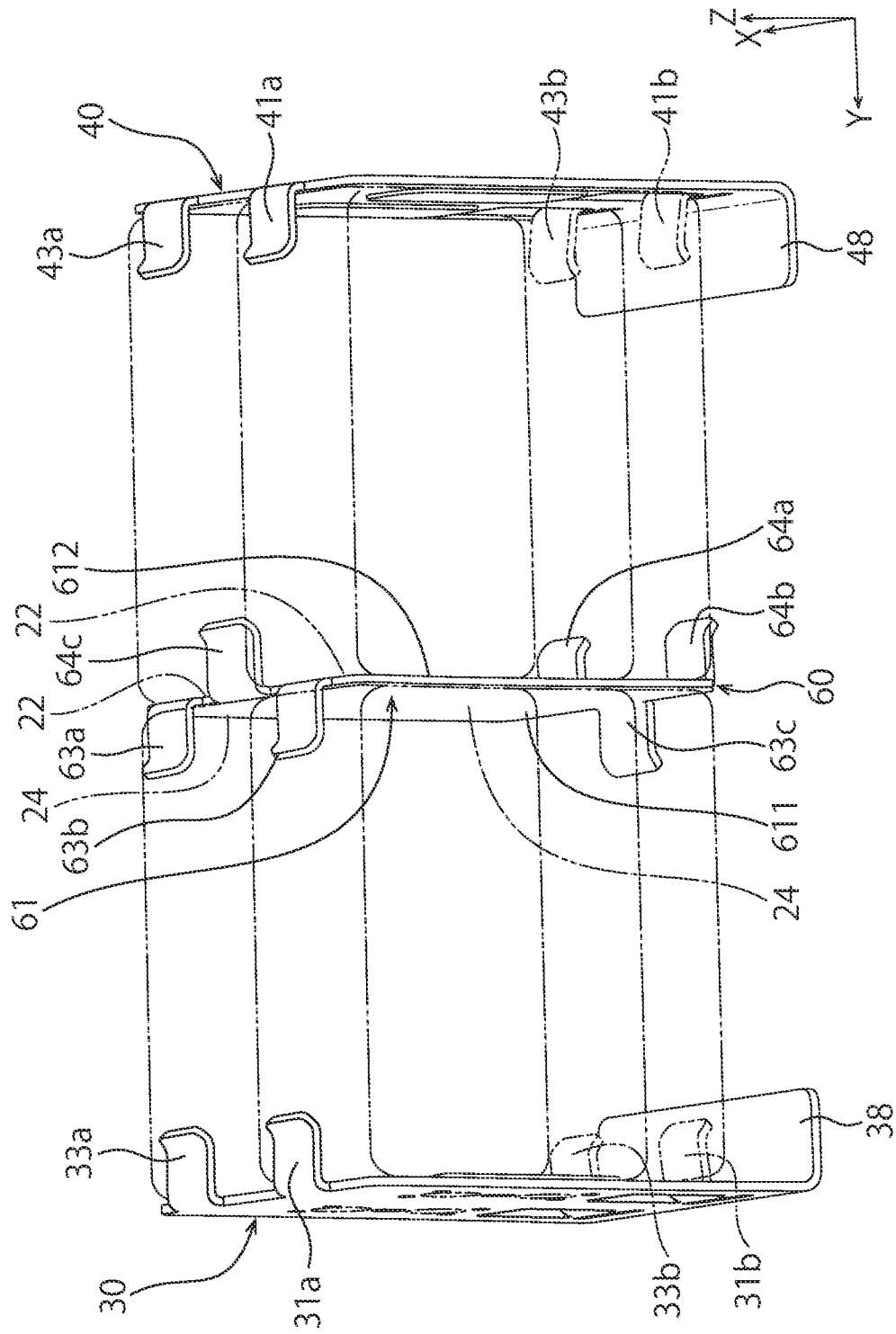

ELECTRONIC DEVICE

BACKGROUND OF THE INVENTION

1. Field of the Invention

The present invention relates to an electronic device with a metal terminal.

2. Description of the Related Art

In addition to a normal chip component that is solely directly mounted on a board, as shown in Patent Document 1 for example, a chip component attached with a metal terminal is proposed as an electronic device, such as a ceramic capacitor.

It is reported that the electronic device attached with a metal terminal after being mounted has a reduction effect on a deformation stress that travels from a board to a chip component and a protection effect on a chip component from impacts or so. Thus, the electronic device attached with a metal terminal is used in a field where durability, reliability, and the like are required.

In conventional electronic devices with a metal terminal, however, terminal electrodes of chip components are connected by solder or so for arrangement of a plurality of chip components in series as shown in Patent Document 1. Thus, if a stress is generated due to deformation and vibration of a substrate or so, cracks are generated in the chip components, and the connection between each of the chip components may be released.

Patent Document 1: JP2000235931 (A)

SUMMARY OF THE INVENTION

The present invention has been achieved under such circumstances. It is an object of the invention to provide an electronic device capable of sufficiently securing a joint reliability between each chip component.

To achieve the above object, an electronic device according to the present invention includes:

a plurality of chip components;

an intermediate metal terminal configured to connect end surfaces of terminal electrodes of the chip components; and an outer metal terminal connectable to the terminal electrode positioned opposite to the terminal electrode connectable to the intermediate metal terminal.

The electronic device of the present invention includes an intermediate metal terminal configured to connect end surfaces of terminal electrodes of the chip components. Since the chip components are connected via the intermediate metal terminal, even if a substrate is deformed, vibrated, or the like after the electronic device is mounted, a stress acting between the chip components is reduced. Thus, cracks are hard to be generated between the chip components, and a joint reliability between each chip component can efficiently be secured.

A terminal electrode of a chip component differing from the plurality of chip components may be connected to one surface or the other surface of the intermediate metal terminal. In this structure, the plurality of chip components can be connected in parallel via the intermediate metal terminal, and the electronic device of the present invention can have a high capacitance in case of using, for example, capacitors as the chip components.

The intermediate metal terminal may include a plurality of holding pieces for sandwiching and holding the chip components. In this structure, the chip components are hard to fall off from the intermediate metal terminal, and a stress acting between each of the chip components is further reduced. Thus, a joint reliability between each of the chip components can effectively be secured.

Preferably, the holding pieces are respectively formed on one end or the other end of the intermediate metal terminal and are arranged to be shifted so as not to overlap with each other when viewed from one end or the other end of the intermediate metal terminal. In this structure, a stress acting between each of the chip components is further reduced, and a joint reliability between each of the chip components can effectively be secured.

Preferably, each of the holding pieces is in contact with the single chip component or the multiple chip components. In this structure, each of the chip components can be sandwiched and held by the holding piece in contact with the single chip component and the holding piece in contact with the multiple chip components. Thus, each of the chip components can stably be held, and a joint reliability between each of the chip components and the intermediate metal terminal can sufficiently be secured.

Preferably, the holding piece in contact with the multiple chip components is wider than the holding piece in contact with the single chip component. In this structure, the holding piece in contact with the multiple chip components has an increased contact area therewith and can stably hold each of the chip components, and a joint reliability between each of the chip components can effectively be secured.

Preferably, the electronic device includes a pair of outer metal terminals, and each of the multiple holding pieces protrudes toward one of the outer metal terminals or the other outer metal terminal. In this structure, the chip component disposed near one of the outer metal terminals and the chip component disposed near the other outer metal terminal can stably be held, and a joint reliability between each of the chip components can effectively be secured.

BRIEF DESCRIPTION OF THE DRAWINGS

FIG. 1B is a schematic perspective view illustrating an intermediate metal terminal and outer metal terminals shown in FIG. 1A.

DESCRIPTION OF THE PREFERRED EMBODIMENTS

Hereinafter, the present invention is described based on embodiments shown in the figures.

First Embodiment

Figure 1A:
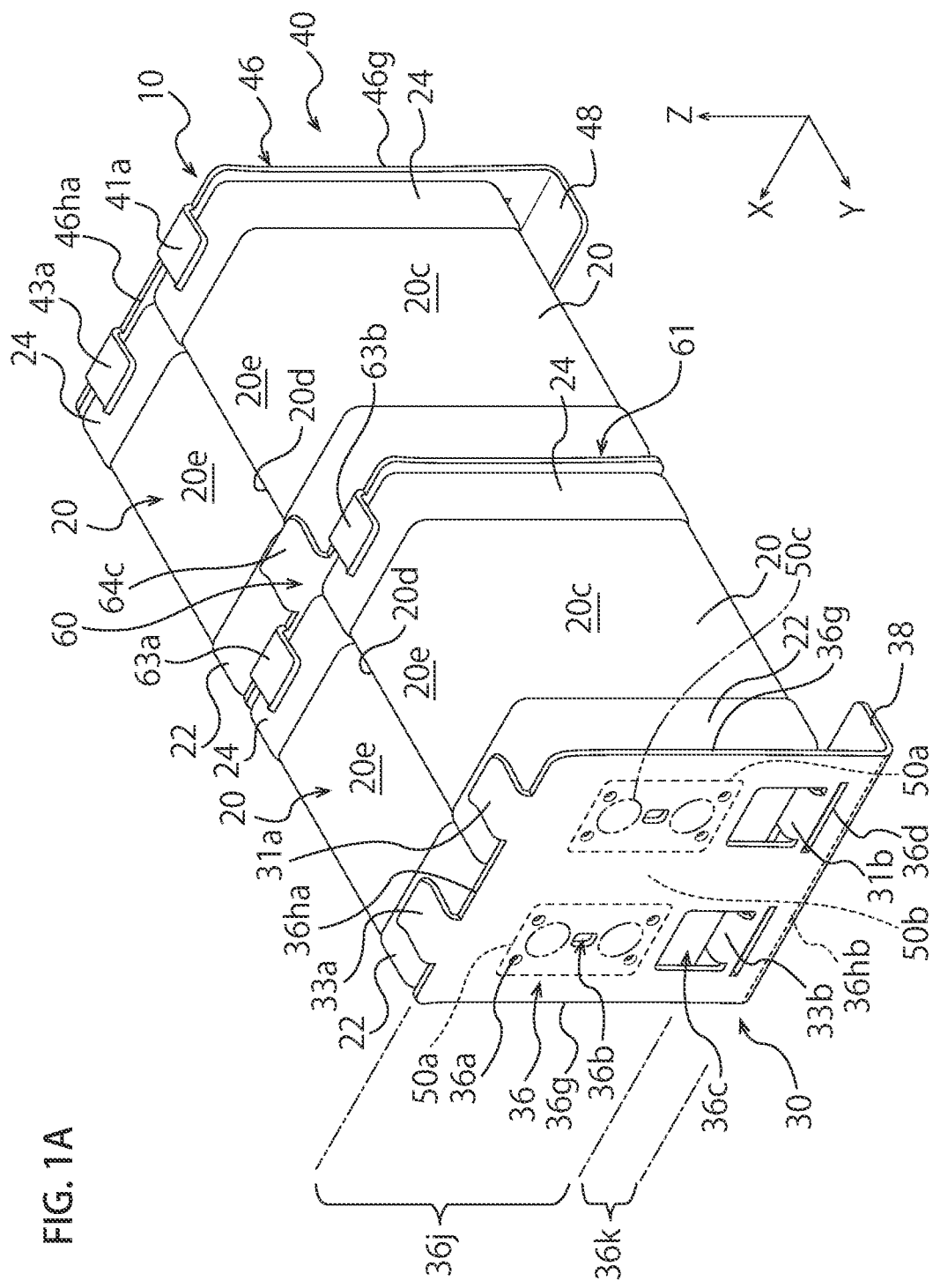
FIG. 1A is a schematic perspective view illustrating a ceramic electronic device according to an embodiment of the present invention.

FIG. 1A is a schematic perspective view illustrating a capacitor 10 as an electronic device according to First Embodiment of the present invention. The capacitor 10 has capacitor chips 20 as chip components, a pair of outer metal terminals 30 and 40, and an intermediate metal terminal 60. The capacitor 10 according to First Embodiment has four capacitor chips 20, but the capacitor 10 may have any plural capacitor chips 20.

Incidentally, each embodiment is described with a capacitor where the capacitor chips 20 are equipped with the outer metal terminals 30 and 40 and the intermediate metal terminal 60, but the ceramic electronic device of the present invention is not limited to this capacitor and may be a chip component other than capacitors equipped with the outer metal terminals 30 and 40 and the intermediate metal terminal 60.

In the figures, the X-axis, the Y-axis, and the Z-axis are perpendicular to each other. The X-axis is parallel to a direction where the capacitor chips 20 are arranged as shown in FIG. 1A, the Z-axis corresponds with a height direction of the capacitor 10 from a mount surface, and the Y-axis corresponds with a direction where a pair of terminal electrodes 22 and 24 of the chip 20 is mutually arranged on the opposite side.

Figure 2:
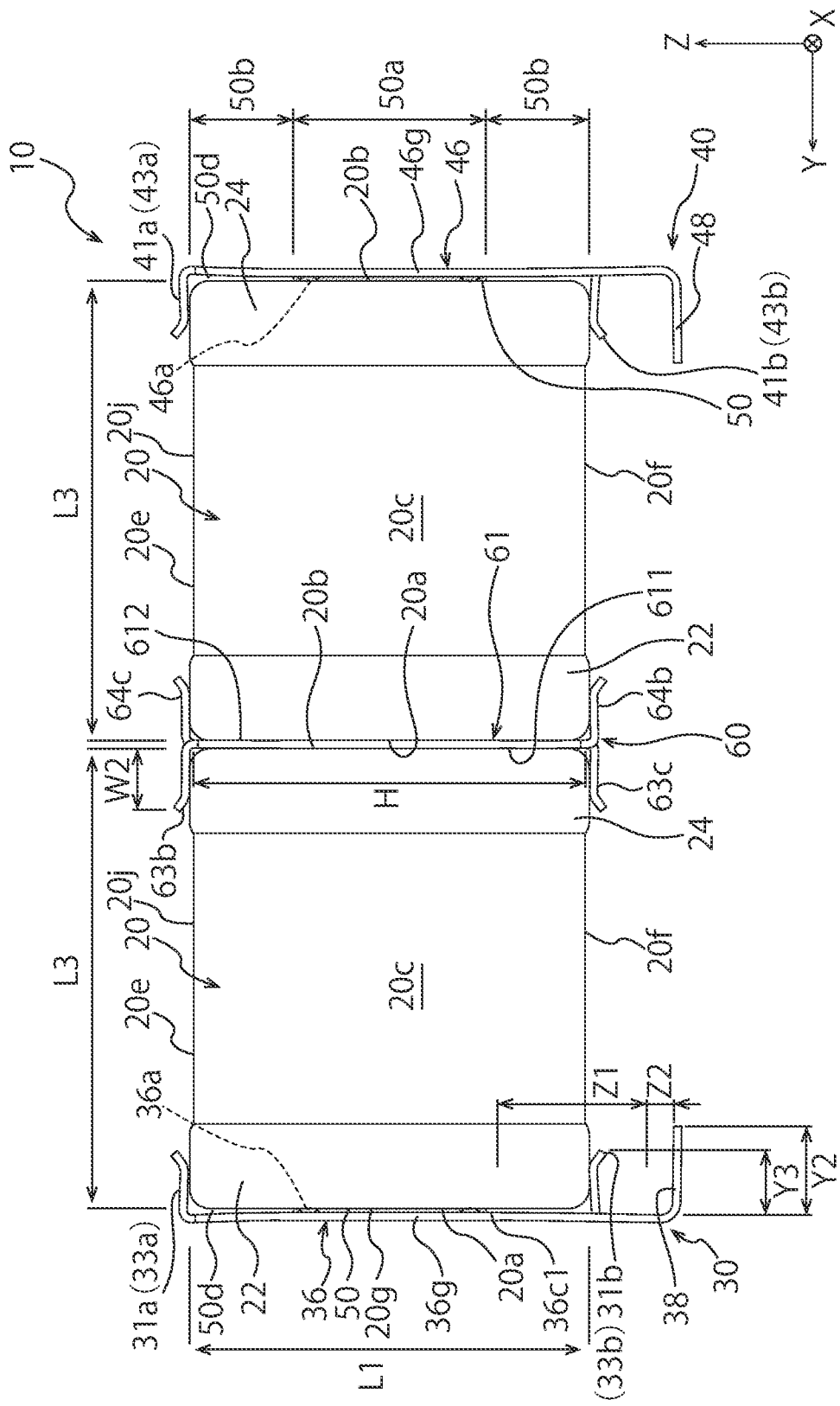
FIG. 2 is a front view of the ceramic electronic device shown in FIG. 1A.
Figure 4:
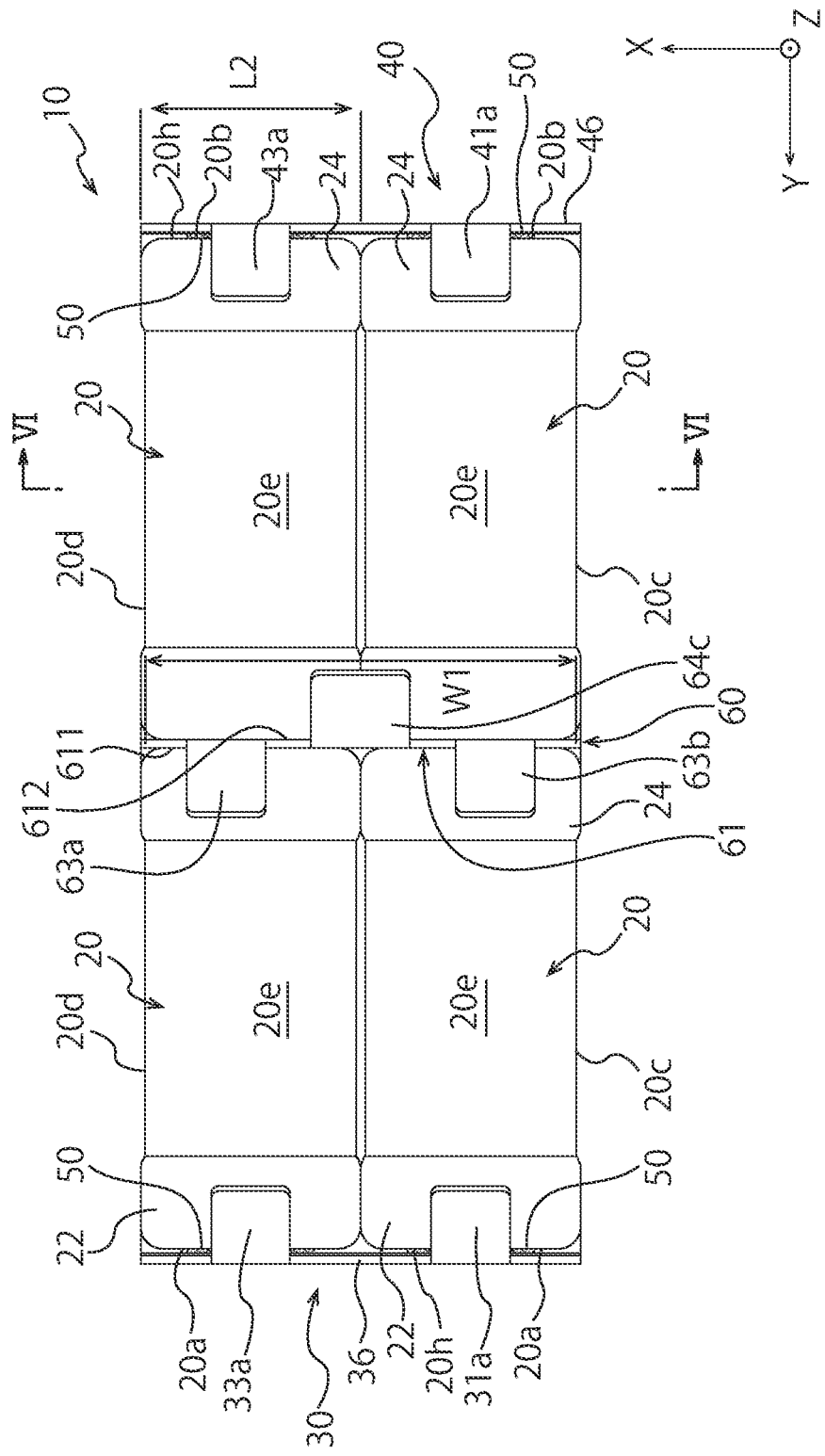
FIG. 4 is a top view of the ceramic electronic device shown in FIG. 1A.

The capacitor chips 20 have an approximately rectangular parallelepiped shape, and each of the four capacitor chips 20 has approximately the same shape and size. As shown in FIG. 2, the capacitor chips 20 have a pair of chip end surfaces facing each other, and the pair of chip end surfaces consists of a first end surface 20a and a second end surface 20b. As shown in FIG. 1A, FIG. 2, and FIG. 4, the first and second end surfaces 20a and 20b have an approximately rectangular shape. In four sides constituting each rectangle of the first and second end surfaces 20a and 20b, a pair of longer sides is chip first sides 20g (see FIG. 2), and a pair of shorter sides is chip second sides 20h (see FIG. 4).

The capacitor chips 20 are arranged so that the first end surfaces 20a and the second end surfaces 20b are perpendicular to a mount surface. In other words, the chip third sides 20j (see FIG. 2) of the capacitor chips 20 connecting between the first end surfaces 20a and the second end surfaces 20b are parallel to the mount surface of the capacitor 10. Incidentally, the mount surface of the capacitor 10 is a surface attached with the capacitor 10 by solder or so and facing mount portions 38 and 48 of the outer metal terminals 30 and 40 mentioned below, and is a parallel surface to the X-Y plane shown in FIG. 1A.

Compared a length L1 of the chip first side 20g shown in FIG. 2 with a length L2 of the chip second side 20h shown in FIG. 4, the chip second side 20h is shorter than the chip first side 20g (L1>L2). The chip first side 20g and the chip second side 20h have any length ratio, but L2/L1 is about 0.3 to 0.7, for example.

The capacitor chips 20 are arranged so that the chip first sides 20g are perpendicular to the mount surface as shown in FIG. 2, and that the chip second sides 20h are parallel to the mount surface as shown in FIG. 4. In the first to fourth side surfaces 20c to 20f (the four chip side surfaces connecting the first end surfaces 20a and the second end surfaces 20b), the first and second side surfaces 20c and 20d have large areas and are arranged perpendicularly to the mount surface, and the third and fourth side surfaces 20e and 20f have areas that are smaller than those of the first and second side surfaces 20c and 20d and are arranged in parallel to the mount surface. The third side surfaces 20e are upper side surfaces facing the opposite direction to the mount portions 38 and 48 below, and the fourth sides surfaces 20f are lower side surfaces facing the mount portions 38 and 48.

As shown in FIG. 1A, FIG. 2, and FIG. 4, first terminal electrodes 22 of the capacitor chips 20 are formed to range from the first end surfaces 20a to a part of the first to fourth side surfaces 20c to 20f. Thus, the first terminal electrode 22 has a part arranged on the first end surface 20a and a part arranged on the first to fourth side surfaces 20c and 20f.

Figure 1C:
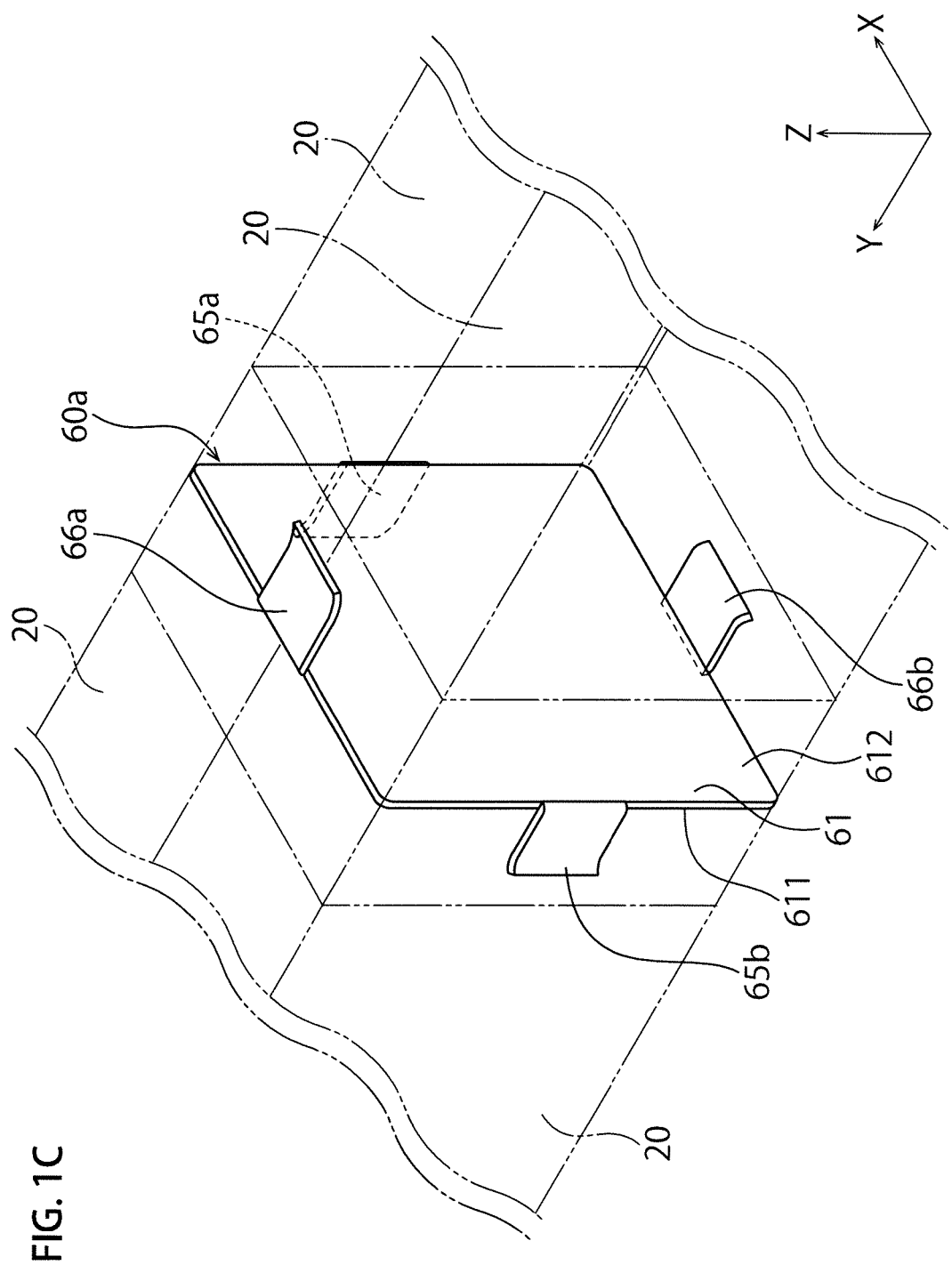
FIG. 1C is a schematic perspective view illustrating a variation of the intermediate metal terminal shown in FIG. 1B.
Figure 1D:
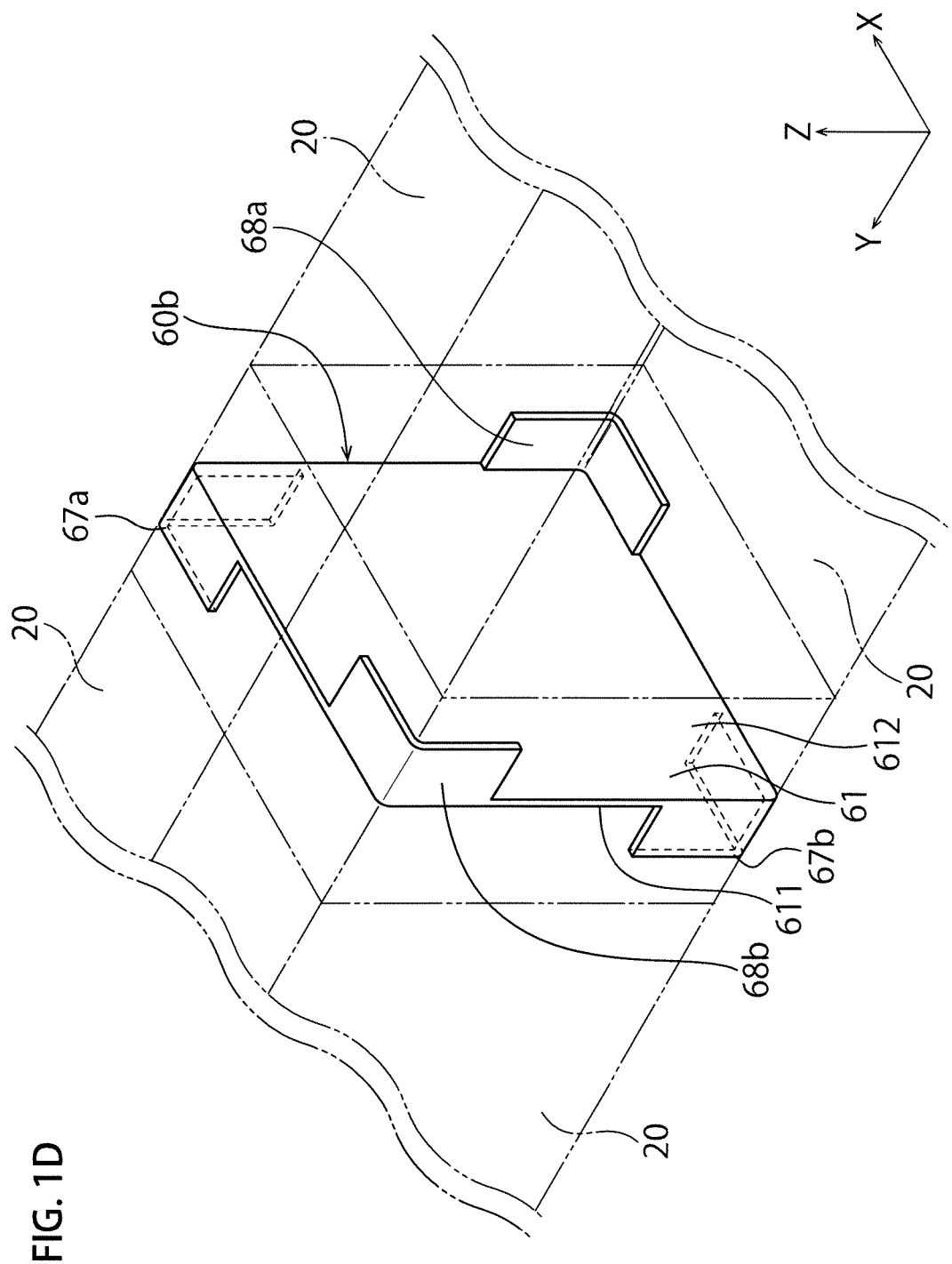
FIG. 1D is a schematic perspective view illustrating another variation of the intermediate metal terminal shown in FIG. 1B.

The second terminal electrodes 24 of the capacitor chips 20 are formed to range from the second end surfaces 20b to another part of the first to fourth side surfaces 20c to 20f (a different part from the part where the first terminal electrodes 22 reach). Thus, the second terminal electrode 24 has a part arranged on the second end surface 20b and a part arranged on the first to fourth side surfaces 20c to 20f (see FIG. 1, FIG. 2, and FIG. 4). The first terminal electrodes 22 and the second terminal electrodes 24 are arranged with a predetermined distance on the first to fourth side surfaces 20c to 20f.

Figure 6:
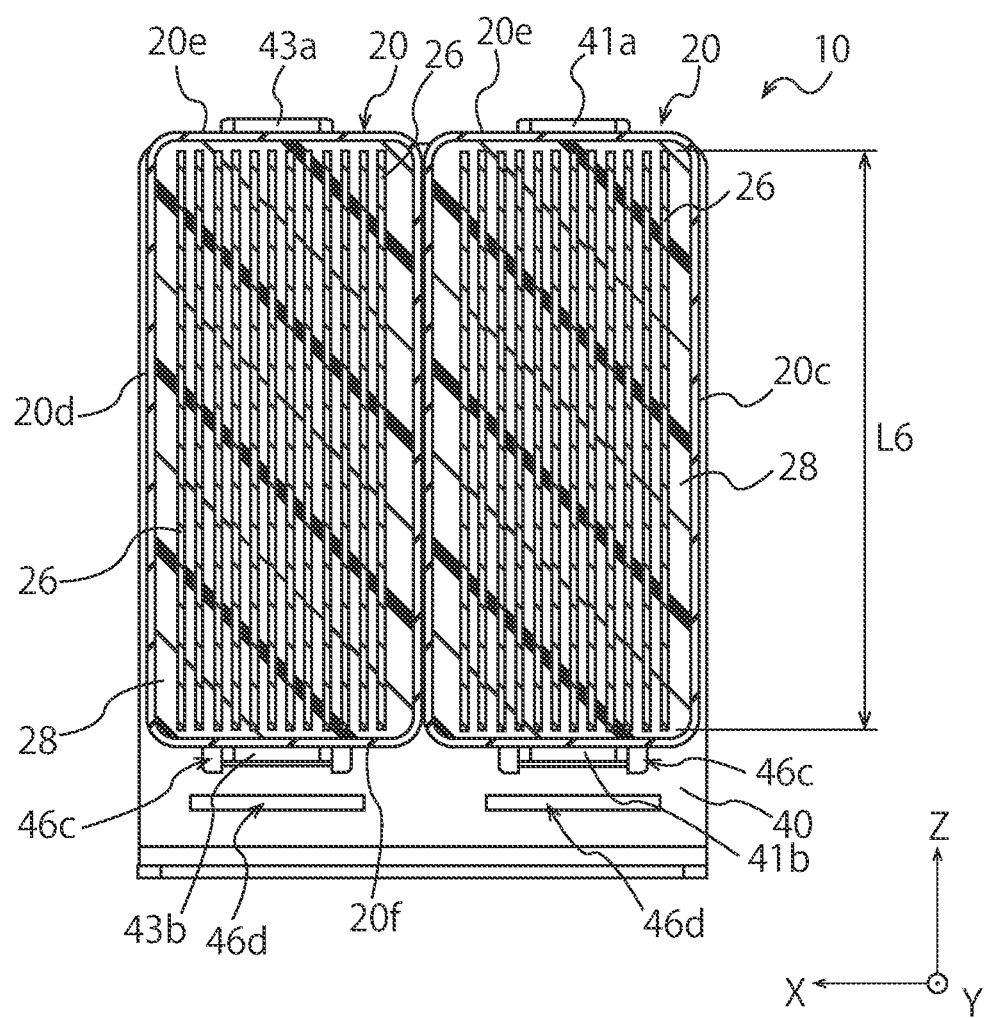
FIG. 6 is a cross-sectional view perpendicular to the Y-axis of the ceramic electronic device shown in FIG. 1A.

As shown in FIG. 6, which schematically illustrates an internal structure of the capacitor chips 20, the capacitor chips 20 are a multilayer capacitor where internal electrode layers 26 and dielectric layers 28 are laminated. In the internal electrode layers 26, internal electrode layers 26 connected with the first terminal electrodes 22 and internal electrode layers 26 connected with the second terminal electrodes 24 are laminated alternately by sandwiching the dielectric layers 28.

As shown in FIG. 6, the internal electrode layers 26 of the capacitor chips 20 have a lamination direction that is parallel to the X-axis and perpendicular to the Y-axis. That is, the internal electrode layers 26 shown in FIG. 6 are arranged in parallel to the plane of the Z-axis and the Y-axis and perpendicularly to the mount surface.

The dielectric layers 28 of the capacitor chips 20 are composed of any dielectric material, such as calcium titanate, strontium titanate, barium titanate, and a mixture thereof. Each of the dielectric layers 28 has any thickness, but normally has a thickness of 1 μm to several hundred μm. In the present embodiment, each of the dielectric layers 28 preferably has a thickness of 1.0 to 5.0 μm. The dielectric layers 28 preferably have a main component of barium titanate, which can increase capacitance of capacitors.

The internal electrode layers 26 contain any conductive material, but may contain a comparatively inexpensive base metal when the dielectric layers 28 are composed of a reduction resistant material. The base metal is preferably Ni or a Ni alloy. The Ni alloy is preferably an alloy of Ni and one or more elements of Mn, Cr, Co, and Al, and preferably contains Ni at 95 wt % or more. Incidentally, Ni or the Ni alloy may contain various fine components, such as P, at about 0.1 wt % or less. The internal electrode layers 26 may be formed using a commercially available electrode paste. Each of the internal electrode layers 26 has a thickness appropriately determined based on usage or so.

The first and second terminal electrodes 22 and 24 are also composed of any material. The first and second terminal electrodes 22 and 24 are normally composed of copper, copper alloy, nickel, nickel alloy, or the like, but may be composed of silver, an alloy of silver and palladium, or the like. Each of the first and second terminal electrodes 22 and 24 also has any thickness, but normally has a thickness of about 10 to 50 μm. Incidentally, at least one metal film of Ni, Cu, Sn, etc. may be formed on the surfaces of the first and second terminal electrodes 22 and 24.

The capacitor chips 20 have shape and size that are appropriately determined based on object and usage. For example, the capacitor chip 20 has a length (L3 shown in FIG. 2) of 1.0 to 6.5 mm, preferably 3.2 to 5.9 mm, a width (L1 shown in FIG. 2) of 0.5 to 5.5 mm, preferably 1.6 to 5.2 mm, and a thickness (L2 shown in FIG. 4) of 0.3 to 3.5 mm, preferably 0.8 to 3.2 mm. When the capacitor 10 has a plurality of capacitor chips 20, each of the capacitor chips 20 may have mutually different size and shape.

As shown in FIG. 1B, the intermediate metal terminal 60 is present between two capacitor chips 20 arranged on one side in the Y-axis direction (the positive side in the Y-axis direction with the first outer metal terminal 30) and two capacitor chips 20 arranged on the other side in the Y-axis direction (the negative side in the Y-axis direction with the second outer metal terminal 40).

The intermediate metal terminal 60 includes a connection portion 61 and engagement arm portions (holding pieces) 63a to 63c and 64a to 64c. In the connection portion 61, four capacitor chips 20 are connected. The engagement arm portions (holding pieces) 63a to 63c and 64a to 64c sandwich and hold the four capacitor chips 20 connected to the connection portion 61.

The connection portion 61 is as thick as the outer metal terminal 30 (40) in the Y-axis direction, but may be different from the outer metal terminal 30 (40) in thickness in the Y-axis direction. The connection portion 61 includes a first connection surface 611 directed to one side in the Y-axis direction and a second connection surface 612 directed to the other side in the Y-axis direction.

The first connection surface 611 and second connection surface 612 have an approximately rectangular or square shape and have a flat shape parallel to the XZ plane. Among the four capacitor chips 20, the first connection surface 611 is connected with the terminal electrodes 24 and 24 of the two capacitor chips 20 arranged on one side in the Y-axis direction, and the second connection surface 612 is connected with the terminal electrodes 22 and 22 of the two capacitor chips 20 arranged on the other side in the Y-axis direction.

As shown in FIG. 2, a height H of the first connection surface 611 in the Z-axis direction is substantially equal to a height of the terminal electrodes 24 of the capacitor chips 20 in the Z-axis direction. As shown in FIG. 4, a width W1 of the first connection surface 611 in the X-axis direction is approximately twice as large as a width of the terminal electrode 24 of the capacitor chip 20 in the X-axis direction. When the first connection surface 611 has a height H in the Z-axis direction and a width W1 in the X-axis direction configured as mentioned above, the two capacitor chips 20 arranged on one side in the Y-axis direction can be connected to the inner side of the first connection surface 611 without protruding to the outside of the intermediate metal terminal 60.

However, the first connection surface 611 does not necessarily have the above-mentioned height H in the Z-axis direction and the above-mentioned width W1 in the X-axis direction, and the two capacitor chips 20 arranged on one side in the Y-axis direction may protrude to the outside of the intermediate metal terminal 60.

As shown in FIG. 2, a height of the second connection surface 612 in the Z-axis direction is equal to a height H of the first connection surface 611 in the Z-axis direction. As shown in FIG. 4, a width of the second connection surface 612 in the X-axis direction is equal to a width W1 of the first connection surface 611 in the X-axis direction. When the second connection surface 612 has a height H in the Z-axis direction and a width W1 in the X-axis direction configured as mentioned above, the two capacitor chips 20 arranged on the other side in the Y-axis direction can be connected to the inner side of the second connection surface 612 without protruding to the outside of the intermediate metal terminal 60.

However, the second connection surface 612 does not necessarily have the above-mentioned height H in the Z-axis direction and the above-mentioned width W1 in the X-axis direction, and the two capacitor chips 20 arranged on the other side in the Y-axis direction may protrude to the outside of the intermediate metal terminal 60.

In the present embodiment, it is accordingly possible to connect end surfaces of the terminal electrodes 24 and 24 of the two capacitor chips 20 arranged on one side in the Y-axis direction and end surfaces of the terminal electrodes 22 and 22 of the two capacitor chips 20 arranged on the other side in the Y-axis direction via the intermediate metal terminal 60.

Thus, the two capacitor chips 20 and 20 arranged on one side in the Y-axis direction and the two capacitor chips 20 and 20 arranged on the other side in the Y-axis direction can be connected in series via the intermediate metal terminal 60 (by sandwiching the intermediate metal terminal 60). Moreover, the two capacitor chips 20 on one side in the Y-axis direction can be connected in parallel, and the two capacitor chips 20 on the other side in the Y-axis direction can be connected in parallel, via the intermediate metal terminal 60 (without sandwiching the intermediate metal terminal 60). In the present embodiment, the capacitor 10 can thereby have a high capacitance.

As shown in FIG. 1B, all of the engagement arm portions 63a, 63b, and 63c protrude toward one side in the Y-axis direction. The engagement arm portions 63a and 63b are connected to one end (upper end) of the connection portion 61 in the Z-axis direction. In the present embodiment, the engagement arm portions 63a and 63b are arranged on both sides of the upper end of the connection portion 61 in the X-axis direction. The engagement arm portions 63a and 63b are arranged at any position as long as they are positioned on both sides of the engagement arm portion 63c in the X-axis direction.

The engagement arm portion 63a is in contact with one of the two capacitor chips 20 connectable with the first connection surface 611, and the engagement arm portion 63b is in contact with the other capacitor chip 20 connectable with the first connection surface 611. That is, each of the engagement arm portions 63a and 63b is in contact with the upper part of the second terminal electrode 24 of the single capacitor chip 20.

The engagement arm portion 63c is connected to the other end (lower end) of the connection portion 61 in the Z-axis direction. In the present embodiment, the engagement arm portion 63c is disposed at an approximately center of the lower end of the connection portion 61 in the X-axis direction. The engagement arm portion 63c is in contact with both of the second terminal electrodes 24 and 24 of the two capacitor chips 20 connectable with the first connection surface 611. That is, the engagement arm portion 63c is in contact with the lower parts of the second terminal electrodes 24 and 24 of the capacitor chips 20.

Unlike the engagement arm portions 31a, 31b, 33a, and 33b of the first outer metal terminal 30 mentioned below, the engagement arm portions 63a, 63b, and 63c are not paired and are arranged to be shifted each other in the X-axis direction. The two capacitor chips 20 connectable with the first connection surface 611 can be sandwiched and held together by the three engagement arm portions 63a, 63b, and 63c. Thus, the capacitor chips 20 can stably be held, and a joint reliability between each of the capacitor chips 20 and the intermediate metal terminal 60 can sufficiently be secured.

All of the engagement arm portions 64a, 64b, and 64c protrude toward the other side in the Y-axis direction. The engagement arm portions 64a and 64b have the same shape as the engagement arm portions 63a and 63b. The engagement arm portion 64c have the same shape as the engagement arm portion 63c.

The engagement arm portions 64a and 64b are connected to the other end (lower end) of the connection portion 61 in the Z-axis direction. In the present embodiment, the engagement arm portions 64a and 64b are arranged on both sides of the lower end of the connection portion 61 in the X-axis direction. The engagement arm portions 64a and 64b are arranged at any position as long as they are positioned on both sides of the engagement arm portion 64c in the X-axis direction.

The engagement arm portion 64a is in contact with one of the two capacitor chips 20 connectable with the second connection surface 612, and the engagement arm portion 64b is in contact with the other capacitor chip 20 connectable with the second connection surface 612. That is, each of the engagement arm portions 64a and 64b is in contact with the lower part of the first terminal electrode 22 of the single capacitor chip 20.

The engagement arm portion 64c is connected to one end (upper end) of the connection portion 61 in the Z-axis direction. In the present embodiment, the engagement arm portion 64c is disposed at an approximately center of the upper end of the connection portion 61 in the X-axis direction. The engagement arm portion 64c is in contact with both of the first terminal electrodes 22 and 22 of the two capacitor chips 20 connectable with the second connection surface 612. That is, the engagement arm portion 64c is in contact with the upper parts of the first terminal electrodes 22 and 22 of the capacitor chips 20.

Unlike the engagement arm portions 31a, 31b, 33a, and 33b of the first outer metal terminal 30 mentioned below, the engagement arm portions 64a, 64b, and 64c are not paired and are arranged to be shifted each other in the X-axis direction. The two capacitor chips 20 connectable with the second connection surface 612 can be sandwiched and held together by the three engagement arm portions 64a, 64b, and 64c. Thus, the capacitor chips 20 can stably be held, and a joint reliability between each of the capacitor chips 20 and the intermediate metal terminal 60 can sufficiently be secured.

Figure 5:
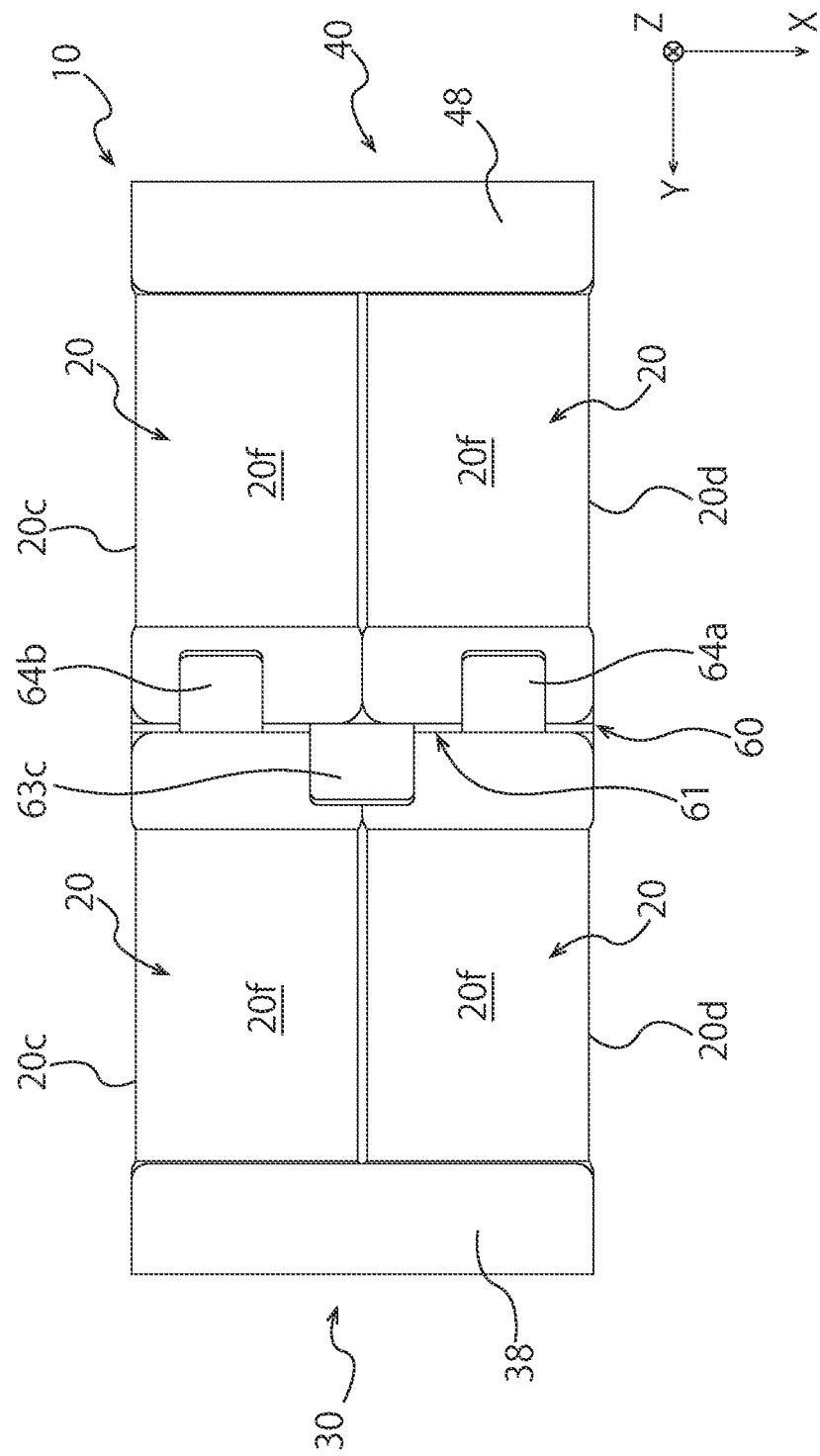
FIG. 5 is a bottom view of the ceramic electronic device shown in FIG. 1A.

As shown in FIG. 4 and FIG. 5, the engagement arm portions 63a, 63b, 64a, and 64b have a width in the X-axis direction that is approximately equal to a width in the X-axis direction of the engagement arm portion 31a or so of the first outer metal terminal 30 mentioned below, but the engagement arm portions 63a, 63b, 64a, and 64b may have a width in the X-axis direction that is different from a width in the X-axis direction of the engagement arm portion 31a or so of the first outer metal terminal 30 mentioned below.

The engagement arm portions 63c and 64c in contact with the multiple capacitor chips 20 are formed more widely in the X-axis direction compared to the engagement arm portions 63a, 63b, 64a, and 64b in contact with the single capacitor chip 20. Preferably, each of the engagement arm portions 63c and 64c has a width in the X-axis direction that is approximately 1.1 to 2 times larger than a width of each of the engagement arm portions 63a, 63b, 64a, and 64b in the X-axis direction.

In this structure, each of the engagement arm portions 63c and 64c has an increased contact area with two capacitor chips 20 connected to the first connection portion 611 or the second connection portion 612 and can stably hold each of the capacitor chips 20, and a joint reliability between each of the capacitor chips 20 can effectively be secured.

As clearly shown by comparing FIG. 4 and FIG. 5, the engagement arm portions 63a and 63b and the engagement arm portions 64a and 64b protrude in opposite directions in the Y-axis direction, and the engagement arm portion 63c and the engagement arm portion 64c protrude in opposite directions in the Y-axis direction. That is, the engagement arm portions 63a, 63b, and 64c and the engagement arm portions 63c, 64a, and 64b protrude reversely (asymmetrically) at the upper end and the lower end of the connection portion 61.

In this structure, two capacitor chips 20 connected to the first connection surface 611 and two capacitor chips 20 connected to the second connection surface 612 can stably be held, and a joint reliability between each of the capacitor chips 20 can effectively be secured.

In the present embodiment, as shown in FIG. 4, the engagement arm portions 63a, 63b, and 64c at the upper end of the connection portion 61 protrude in the Y-axis direction in an alternate manner in the X-axis direction. As shown in FIG. 5, the engagement arm portions 63c, 64a, and 64b at the lower end of the connection portion 61 protrude in the Y-axis direction in an alternate manner in the X-axis direction.

As shown in FIG. 1B, the engagement arm portions 63a to 63c and 64a to 64c are arranged to be shifted (alternately) in the X-axis direction so as not to overlap with each other when viewed from one end or the other end of the intermediate metal terminal 60 in the Z-axis direction.

When the intermediate metal terminal 60 is rotated on the YZ plane by 180 degrees, the intermediate metal terminal 60 has a corresponding outer shape before and after the rotation. That is, the intermediate metal terminal 60 is configured to be point-symmetry in the X-axis direction or the Z-axis direction with a symmetry point (a center of the first connection surface 611 or the second connection surface 612).

The intermediate metal terminal 60 and the terminal electrodes 22 and 24 of each of the capacitor chips 20 are connected electrically and mechanically via a conductive connection member (not illustrated), such as solder and conductive adhesive. Incidentally, the engagement arm portions 63a to 63c and 64a to 64c are not provided with the conductive connection member.

Among the terminal electrodes 22 and 24 of each of the four capacitor chips 20, a pair of outer metal terminals 30 and 40 of the capacitor 10 is connected to the terminal electrodes 22 and 24 positioned opposite to terminal electrodes 22 and 24 connected to the intermediate metal terminal 60. That is, the first outer metal terminal 30 (one of the pair of outer metal terminals 30 and 40) is connected to the first terminal electrodes 22 positioned opposite to the second terminal electrodes 24 of the two capacitor chips 20 connected to the first connection surface 611 of the intermediate metal terminal 60. Likewise, the second outer metal terminal 40 (the other of the pair of outer metal terminals 30 and 40) is connected to the second terminal electrodes 24 positioned opposite to the first terminal electrodes 22 of the two capacitor chips 20 connected to the second connection surface 612 of the intermediate metal terminal 60.

The first outer metal terminal 30 has a terminal body 36, a plurality of pairs of engagement arm portions (holding pieces) 31a, 31b, 33a, and 33b, and a mount portion 38. The terminal body 36 faces the first terminal electrodes 22. The engagement arm portions 31a, 31b, 33a, and 33b sandwich and hold the capacitor chips 20 from both ends of the chip first sides 20g in the Z-axis direction. The mount portion 38 extends from the terminal body 36 toward the capacitor chips 20 and is at least partially approximately perpendicular to the terminal body 36.

Figure 3A:
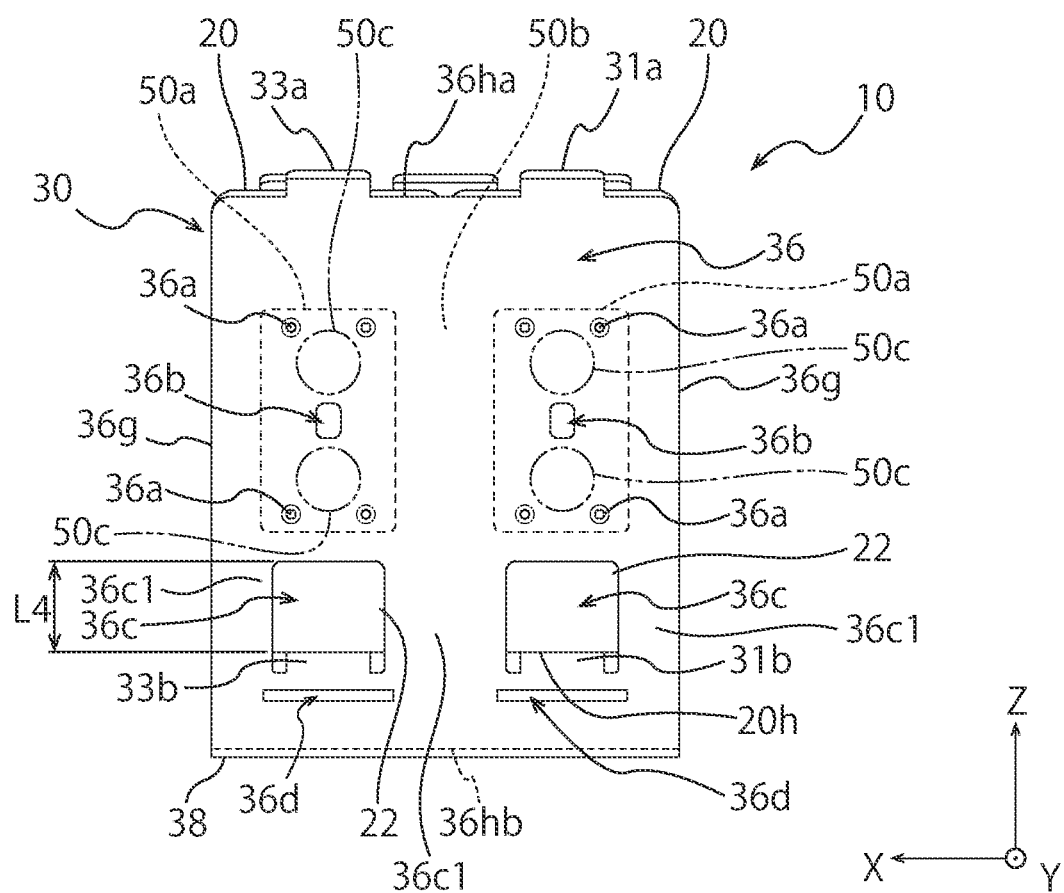
FIG. 3A is a left-side view of the ceramic electronic device shown in FIG. 1A.

As shown in FIG. 2, the terminal body 36 has a substantially rectangular flat shape having a pair of terminal first sides 36g approximately parallel to the chip first sides 20g perpendicular to the mount surface and a pair of terminal second sides 36ha and 36hb approximately parallel to the chip second sides 20h parallel to the mount surface as shown in FIG. 3A.

As shown in FIG. 3A, the terminal second sides 36ha and 36hb parallel to the mount surface have a length that is several times plus or minus alpha of a length L2 (see FIG. 4) of the chip second sides 20h arranged in parallel to the terminal second sides 36ha and 36hb. That is, the terminal body 36 has a width in the X-axis that is approximately equal to a length obtained by multiplying the number of capacitor chips 20 contained in the capacitor 10 shown in FIG. 3A with a width of the capacitor chips 20 in the X-axis direction, but the terminal body 36 may have a width in the X-axis that is slightly shorter or longer than this length.

On the other hand, the capacitor 10 according to First Embodiment shown in FIG. 3A includes two capacitor chips 20 on one side or the other side in the Y-axis direction, and the terminal second sides 36ha and 36hb parallel to the mount surface have a length that is the same as or slightly longer than a double of a length L2 of the chip second side 20h arranged in parallel to the terminal second sides 36ha and 36hb. As shown in FIG. 1A, a capacitor chip that can be combined with the outer metal terminals 30 and 40 does not have the only one size, and the outer metal terminals 30 and 40 can constitute an electronic device correspondingly with multiple kinds of capacitor chips 20 having different lengths in the X-axis direction.

The terminal body 36 is electrically and mechanically connected with the first terminal electrodes 22 formed on the first end surfaces 20a facing the terminal body 36. For example, the terminal body 36 and the first terminal electrodes 22 can be connected with each other by arranging a conductive connection member 50, such as a solder and a conductive adhesive, in a space between the terminal body 36 and the first terminal electrodes 22 shown in FIG. 2.

Joint regions 50a are determined as a region where the connection member 50 joins the terminal body 36 and the end surfaces of the first terminal electrodes 22. A non-joint region 50b is determined as a region where the terminal body 36 and the end surfaces of the first terminal electrodes 22 are not joined without the connection member 50, and a space exists between the terminal body 36 and the end surfaces of the first terminal electrodes 22. The space between the terminal body 36 and the end surfaces of the first terminal electrodes 22 in the non-joint region 50b has a thickness that is approximately equal to a thickness of the connection member 50. In the present embodiment, the connection member 50 has a thickness that is determined based on a height of protrusions 36a mentioned below or so. A height of the joint region 50a in the Z-axis direction shown in FIG. 2 corresponds to a first predetermined height.

In the present embodiment, first through holes 36b (see FIG. 1A) are formed on a part of the terminal body 36 facing the first end surfaces 20a. Two first through holes 36b are formed correspondingly with the capacitor chips 20 contained in the capacitor 10, but any shape and number of first through holes 36b may be employed. In the present embodiment, the first through hole 36b is formed in an approximately central part of the joint region 50a.

As shown in FIG. 3A, the joint region 50a is formed by applying the connection member 50 (see FIG. 2) to initial application regions 50c respectively positioned on both sides of the first through hole 36b in the Z-axis direction. That is, after the connection member 50 is applied, the joint region 50a is formed in such a manner that the connection member 50 applied on the initial application regions 50c spreads out by bringing a heating element into contact with the outer surface of the terminal body 36 and pushing it against the end surface of the chip 20. The non-joint region 50b is a region where the connection member 50 is not spread out. In the present embodiment, a total area of the non-joint region 50b between the terminal body 36 and the end surfaces of the terminal electrodes 22 in the Y-axis direction is larger than 3/10, preferably ½ to 10, of a total area of the joint regions 50a.

In the present embodiment, the connection member 50 composed of a solder forms a solder bridge between a periphery of the first through hole 36b and the first terminal electrode 22, and the terminal body 36 and the first terminal electrode 22 can thereby be joined strongly. Moreover, an application state of the connection member 50 in the joint region 50a can be observed from outside via the first through hole 36b. Moreover, bubbles contained in the connection member 50, such as a solder, can be released via the first through hole 36b. This stabilizes the joint even if the amount of the connection member 50, such as a solder, is small.

The terminal body 36 is provided with a plurality of protrusions 36a protruding toward the first end surface 20a of the capacitor chip 20 and touching the first end surface 20a so that the plurality of protrusions 36a surrounds the first through hole 36b. In addition, the protrusions 36a may be formed outside the initial application regions 50c, or the initial application regions 50c may be positioned between the protrusions 36a and the first through hole 36b. Incidentally, the initial application region 50c may protrude from between the protrusion 36a and the first through hole 36b.

The protrusions 36a reduce a contact area between the terminal body 36 and the first terminal electrodes 22. This makes it possible to prevent a vibration generated in the chip capacitors 20 from traveling to the mount board via the first outer metal terminal 30 and prevent an acoustic noise of the ceramic capacitor 10.

The protrusions 36a are formed around the first through hole 36b, and the joint region 50a formed by the spread of the connection member 50, such as a solder, can thereby be adjusted. In the present embodiment, the joint region 50a has a periphery positioned slightly outside the protrusions 36a. In particular, as shown in FIG. 1A, a lower end of the joint region 50a in the Z-axis direction is positioned near an upper opening edge of a second through hole (opening) 36c mentioned below.

In such a capacitor 10, an acoustic noise can be prevented while a connection strength between the terminal body 36 and the first terminal electrodes 22 is adjusted in an appropriate range. Incidentally, four protrusions 36a are formed around one first through hole 36b in the capacitor 10, but any number and arrangement of the protrusions 36a may be employed.

The terminal body 36 is provided with second through holes (openings) 36c having a periphery portion connected with the lower arm portion 31b or 33b (one of multiple pairs of engagement arm portions 31a, 31b, 33a, and 33b). The lower arm portion 31b or 33b is formed by a plate piece corresponding to a punched hole (second through hole 36c) formed on the terminal body 36 and is formed in the middle of the terminal body 36 in the Z-axis direction. The second through holes 36c are positioned closer to the mount portion 38 than the first through holes 36b. Unlike the first through holes 36b, the second through holes 36c are not provided with any connection member, such as a solder. That is, the second through holes 36c are formed in the non-joint region 50b.

In the first outer metal terminal 30, non-opening regions 36c1 are located on both sides of each second through hole 36c in the X-axis direction with the lower arm portion 31b (33b) supporting the capacitor chip 20. The non-opening regions 36c1 function as the non-joint region 50b between the first outer metal terminal 30 and the terminal electrodes 22 and have an easily deformable shape. The first outer metal terminal 30 can thereby effectively demonstrate a reduction effect on stress generated in the capacitor 10 and an absorption effect on vibration of the capacitor chips 20. Thus, the capacitor 10 having the first outer metal terminal 30 can favorably prevent an acoustic noise and have a favorable connection reliability with the mount board when being mounted.

The second through holes 36c have any shape, but preferably have an opening width in the width direction (a parallel direction (X-axis direction) to the terminal second sides 36ha and 36hb) that is larger than the first through holes 36b. When the second through holes 36c have a large opening width, the first outer metal terminal 30 can effectively enhance a reduction effect on stress and a prevention effect on acoustic noise. When the first through holes 36b have an opening width that is smaller than the second through holes 36c, the connection member does not spread excessively. As a result, it is possible to prevent an excessive rise in connection strength between each of the capacitor chips 20 and the terminal body 36 and prevent an acoustic noise.

As shown in FIG. 2, the non-joint regions 50b (the connection member 50 does not exist between the terminal body 36 and the end surfaces of the terminal electrodes 22) are present in the non-opening regions 36c1 of the terminal body 36 within a height L4 (second predetermined height) of the second through holes 36c in the Z-axis direction shown in FIG. 3A. In the present embodiment, the height L4 (second predetermined height) of the second through holes 36c in the Z-axis direction substantially corresponds to a height of the non-joint regions 50b in the Z-axis direction located below the joint regions 50a in the Z-axis direction. The height L4 may, however, be smaller than a height of the non-joint regions 50b in the Z-axis direction.

In the present embodiment, the terminal body 36 of the first outer metal terminal 30 may be warped from the end surface of the terminal electrode 22 toward the arm portions 31a and 31b (holding pieces) in the non-joint regions 50b. In the non-joint regions 50b, a non-joint gap 50d between the terminal body 36 and the end surface of the terminal electrode 22 consequently becomes larger toward the arm portions 31a and 31b.

Incidentally, a minimum width of the non-joint gap 50d is as large as a thickness of the connection member 50. In this range, the arm portions 31a and 31b continuing to the non-joint region 50b can have a favorable elasticity and favorably hold the capacitor chip 20, the outer metal terminal 30 can easily elastically be deformed, and an acoustic noise phenomenon can effectively be prevented.

In the present embodiment, each of the second through holes 36c formed per chip 20 has a width in the X-axis direction that is preferably smaller than a width of each chip 20 in the X-axis direction. In the present embodiment, each of the second through holes 36c has a width in the X-axis direction that is preferably ⅙ to ⅚, more preferably ⅓ to ⅔, of a width of each chip 20 in the X-axis direction.

In the terminal body 36, the second through hole 36c connected with the lower arm portion 31b is formed with a predetermined distance in the height direction against the terminal second side 36hb connected with the mount portion 38, and a slit 36d is formed between the second through hole 36c and the terminal second side 36hb.

In the terminal body 36, the slit 36d is formed between a connection position of the lower arm portion 31b positioned near the mount portion 38 with the terminal body 36 (a lower side of a periphery portion of the second through hole 36c) and the terminal second side 36hb connected with the mount portion 38. The slits 36d extend in a parallel direction to the terminal second sides 36ha and 36hb. The slits 36d can prevent a solder used at the time of mounting the capacitor 10 on a mount board from creeping up on the terminal body 36 and prevent a formation of a solder bridge connected with the lower arm portions 31b and 33b or the first terminal electrodes 22. Thus, the capacitor 10 with the slits 36d demonstrates a prevention effect on acoustic noise.

As shown in FIG. 1A and FIG. 2, the engagement arm portions 31a, 31b, 33a, and 33b of the first outer metal terminal 30 extend from the terminal body 36 to the third or fourth side surface 20e or 20f (chip side surface of the capacitor chips 20). The lower arm portion 31b (33b) (one of the engagement arm portions 31a, 31b, 33a, and 33b) is formed by being bent from the lower edge of the second through hole 36c in the Z-axis direction formed on the terminal body 36. The upper arm portion 31a (33a) (another one of the engagement arm portions 31a, 31b, 33a, and 33b) is formed by being bent from the terminal second side 36ha at the upper part of the terminal body 36 (positive side in the Z-axis direction). That is, in the present embodiment, the upper arm portion 31a (33a) is formed at the upper end of the terminal body 36 in the Z-axis direction.

In the present embodiment, the upper arm portion 31a (33a) has a width in the X-axis direction that is equal to a width of the lower arm portion 31b (33b) in the X-axis direction. The upper arm portion 31a (33a) may, however, have a width in the X-axis direction that is different from a width of the lower arm portion 31*b* (33*b*) in the X-axis direction.

As shown in FIG. 1A, the terminal body 36 has a chip facing part 36*j* and a terminal connection part 36*k*. The chip facing part 36*j* faces the first end surfaces 20*a* of the capacitor chips 20 and is positioned at a height overlapping with the first end surfaces 20*a*. The terminal connection part 36*k* is positioned below the chip facing part 36*j* and is located at a position connecting between the chip facing part 36*j* and the mount portion 38.

The second through holes 36*c* are formed so that their periphery portions range the chip facing part 36*j* and the terminal connection part 36*k*. The lower arm portions 31*b* and 33*b* extend from the terminal connection part 36*k*. That is, bases of the lower arm portions 31*b* and 33*b* are connected with lower sides (opening edges close to the mount portion 38) of approximately rectangular periphery portions of the second through holes 36*c*.

The lower arm portions 31*b* and 33*b* extend from the bases toward inside in the Y-axis direction (toward the central parts of the chips 20) while being bent, touch the fourth side surfaces 20*f* of the capacitor chips 20, and support the capacitor chips 20 from below (see FIG. 2). Incidentally, the lower arm portions 31*b* and 33*b* may tilt upward in the Z-axis direction from the lower sides of the periphery portions of the second through holes 36*c* before the chips 20 are attached. This enables the lower arm portions 31*b* and 33*b* to touch the fourth side surfaces 20*f* of the chips 20 due to the resilience of the lower arm portions 31*b* and 33*b*.

Lower edges (chip second sides 20*h* below) of the first end surfaces 20*a* of the capacitor chips 20 are positioned slightly above the lower sides of the periphery portions of the second through holes 36*c* (the bases of the lower arm portions 31*b* and 33*b*). When the capacitor chips 20 are viewed in the Y-axis direction as shown in FIG. 3A, the lower edges (chip second sides 20*h* below) of the first end surfaces 20*a* of the capacitor chips 20 can be recognized from the side of the capacitor 10 via the second through holes 36*c*.

As shown in FIG. 1A, a pair of upper arm portion 31*a* and lower arm portion 31*b* holds one capacitor chip 20, and a pair of upper arm portion 33*a* and lower arm portion 33*b* holds another one capacitor chip 20. Since a pair of upper arm portion 31*a* and lower arm portion 31*b* (or upper arm portion 33*a* and lower arm portion 33*b*) holds one capacitor chip 20, not multiple capacitor chips 20, the first outer metal terminal 30 can definitely hold each of the capacitor chips 20.

The pair of upper arm portion 31*a* and lower arm portion 31*b* does not hold the capacitor chip 20 from both ends of the chip second sides 20*h* (shorter sides of the first end surface 20*a*), but holds the capacitor chip 20 from both ends of the chip first sides 20*g* (longer sides of the first end surface 20*a*). This increases a distance between the upper arm portion 31*a* (33*a*) and the lower arm portion 31*b* (33*b*) and easily absorbs a vibration of the capacitor chip 20. Thus, the capacitor 10 can favorably prevent an acoustic noise. Incidentally, since the lower arm portions 31*b* and 33*b* extend from the terminal connection part 36*k*, the capacitor chips 20 have a short transmission path between the first terminal electrodes 22 and the mount board, compared to when the lower arm portions 31*b* and 33*b* are connected with the chip facing part 36*j*.

The mount portion 38 is connected with the terminal second side 36*hb* below in the terminal body 36 (negative side in the Z-axis direction). The mount portion 38 extends from the terminal second side 36*hb* below toward the capacitor chips 20 (negative side in the Y-axis direction) and is bent approximately perpendicularly to the terminal body 36. Incidentally, the top surface of the mount portion 38 (a surface of the mount portion 38 closer to the capacitor chips 20) preferably has a solder wettability that is lower than a solder wettability of the bottom surface of the mount portion 38 in order to prevent an excessive scattering of a solder used for mounting the capacitor chips 20 on a board.

The mount portion 38 of the capacitor 10 is mounted on a mount surface, such as a mount board, in a position facing downward as shown in FIG. 1A and FIG. 2. Thus, a length of the capacitor 10 in the Z-axis direction corresponds to a height of the capacitor 10 when it is mounted. In the capacitor 10, the mount portion 38 is connected with the terminal second side 36*hb* on one side of the terminal body 36, and the upper arm portions 31*a* and 33*a* are connected with the terminal second side 36*ha* on the other side of the terminal body 36. Thus, the capacitor 10 has no unnecessary part of the length in the Z-axis direction and is advantageous for low profile.

Since the mount portion 38 is connected with the terminal second side 36*hb* on one side of the terminal body 36, the capacitor 10 can have a small projected area in the Z-axis direction and have a small mount area, compared to prior arts where the mount portion 38 is connected with the terminal first sides 36*g* of the terminal body 36. Since the third and fourth side surfaces 20*e* and 20*f* having small areas among the first to fourth side surfaces 20*c* to 20*f* of the capacitor chips 20 are arranged in parallel to the mount surface as shown in FIG. 1A, FIG. 5, etc., the capacitor 10 can have a small mount area even if the capacitor chips 20 are not overlapped with each other in the height direction.

As shown in FIG. 1A and FIG. 2, the second outer metal terminal 40 has a terminal body 46, a plurality of pairs of engagement arm portions 41*a*, 41*b*, 43*a*, and 43*b*, and a mount portion 48. The terminal body 46 faces the second terminal electrodes 24. The engagement arm portions 41*a*, 41*b*, 43*a*, and 43*b* sandwich and hold the capacitor chips 20 from both ends of the chip first sides 20*g* in the Z-axis direction. The mount portion 48 extends from the terminal body 46 toward the capacitor chips 20 and is at least partially approximately perpendicular to the terminal body 46.

As is the case with the terminal body 36 of the first outer metal terminal 30, the terminal body 46 of the second outer metal terminal 40 has a pair of terminal first sides 46*g* approximately parallel to the chip first sides 20*g* and a terminal second side 46*ha* approximately parallel to the chip second sides 20*h*. The terminal body 46 is provided with protrusions (not illustrated), first through holes (not illustrated), second through holes (not illustrated), and slits 46*d* (see FIG. 6), all of which are similar to the protrusions 36*a*, the first through holes 36*b*, the second through holes 36*c*, and the slits 36*d* formed on the terminal body 36.

As shown in FIG. 1A, the second outer metal terminal 40 is arranged symmetrically to the first outer metal terminal 30 and is different from the first outer metal terminal 30 in arrangement against the capacitor chips 20. The second outer metal terminal 40 is, however, different from the first outer metal terminal 30 only in arrangement against the capacitor chips 20 and has a similar shape to the first outer metal terminal 30. Thus, the second outer metal terminal 40 is not described in detail.

The first outer metal terminal 30 and the second outer metal terminal 40 are composed of any conductive metal material, such as iron, nickel, copper, silver, and an alloy thereof. In particular, the first and second outer metal terminals 30 and 40 are preferably composed of copper in consideration of restraining resistivity of the first and second outer metal terminals 30 and 40 and reducing ESR of the capacitor 10.

Method of Manufacturing Multilayer Capacitor Chip 20

Hereinafter, a method of manufacturing the capacitor 10 is described.

In the manufacture of the multilayer capacitor chip 20, a laminated body is prepared by laminating green sheets (to be the dielectric layers 28 after firing) with electrode patterns to be the internal electrode layers 26 after firing, and a capacitor element body is obtained by pressurizing and firing the obtained laminated body. Moreover, the first and second terminal electrodes 22 and 24 are formed on the capacitor element body by baking and plating a terminal electrode paint, and the capacitor chip 20 is thereby obtained.

A paint for green sheets and a paint for internal electrode layers (raw materials of the laminated body), a raw material of the terminal electrodes, firing conditions of the laminated body and the electrodes, and the like are not limited and can be determined with reference to known methods or so. In the present embodiment, ceramic green sheets whose main component is barium titanate are used as a dielectric material. In the terminal electrodes, a Cu paste is immersed and baked to form a baked layer, and a Ni plating treatment and a Sn plating treatment are conducted, whereby Cu baked layer/Ni plating layer/Sn plating layer is formed.

Method of Manufacturing Outer Metal Terminals 30 and 40 and Intermediate Metal Terminal 60

In the manufacture of the first outer metal terminal 30, a metal plate is initially prepared. The metal plate is composed of any conductive metal material, such as iron, nickel, copper, silver, and an alloy thereof. Next, the metal plate is machined into intermediate members having shapes of the engagement arm portions 31a to 33b, the terminal body 36, the mount portion 38, reinforcement pieces 36f, and the like.

Next, a metal film is formed by plating on the surfaces of the intermediate members formed by machining, and the first outer metal terminal 30 is obtained. Any material, such as Ni, Sn, and Cu, is used for the plating. In the plating treatment, a resist treatment against a top surface of the mount portion 38 can prevent the plating from attaching to the top surface of the mount portion 38. This makes it possible to generate a difference in solder wettability between the top surface and the bottom surface of the mount portion 38. Incidentally, a similar difference can be generated by conducting a plating treatment against the entire intermediate members for formation of a metal film and removing only the metal film formed on the top surface of the mount portion 38 using a laser exfoliation or so.

In the manufacture of the first outer metal terminals 30, a plurality of first outer metal terminals 30 may be formed in a state of being connected with each other from a metal plate continuing in belt shape. The plurality of first outer metal terminals 30 connected with each other is cut into pieces before or after being connected with the capacitor chip 20. Incidentally, the warp of the outer metal terminal 30 in the non-joint region 50b shown in FIG. 2 may be formed at the same time when or after a plurality of first outer metal terminals 30 is formed in a mutually connected state from a metal plate member continuing in a belt state. The second outer metal terminal 40 is manufactured in a similar manner to the first outer metal terminal 30.

In the manufacture of the intermediate metal terminal 60, a metal plate is machined to obtain an intermediate member provided with shapes of the connection portion 61, the engagement arm portions 63a to 63c and 64a to 64c, and the like, and the above-mentioned plating treatment is carried out for this intermediate member, at a manufacturing step of the intermediate member.

Assembly of Capacitor 10

Four capacitor chips 20 obtained in the above-mentioned manner are prepared, and two capacitor chips 20 of the four capacitor chips 20 are held so that the second side surface 20d and the first side surface 20c are arranged to contact with each other as shown in FIG. 1A. Then, end surfaces of the second terminal electrodes 24 in the Y-axis direction of the two capacitor chips 20 are faced with the first connection surface 611 of the intermediate metal terminal 60 shown in FIG. 1B. At this time, a solder, a conductive adhesive, or the like is applied to the end surfaces of the second terminal electrodes 24 in the Y-axis direction of the two capacitor chips 20 arranged on one side in the Y-axis direction (positive side in the Y-axis direction) or to the first connection surface 611 of the intermediate metal terminal 60. After that, the first connection surface 611 is pushed against the end surfaces of the two capacitor chips 20, and the intermediate metal terminal 60 is thereby electrically and mechanically connected to the second terminal electrodes 24 of the two capacitor chips 20.

Next, the other two capacitor chips 20 are held so that the second side surface 20d and the first side surface 20c are arranged to contact with each other as shown in FIG. 1A. Then, the end surfaces of the first terminal electrodes 22 in the Y-axis direction of the two capacitor chips 20 are faced with the second connection surface 612 of the above-mentioned intermediate metal terminal 60. At this time, a solder, a conductive adhesive, or the like is applied to the end surfaces of the first terminal electrodes 22 in the Y-axis direction of the two capacitor chips 20 arranged on the other side in the Y-axis direction (negative side in the Y-axis direction) or to the second connection surface 612 of the intermediate metal terminal 60. After that, the second connection surface 612 is pushed against the end surfaces of the two capacitor chips 20, and the intermediate metal terminal 60 is thereby electrically and mechanically connected to the first terminal electrodes 22 of the capacitor chips 20.

Through the above-mentioned steps, the second terminal electrodes 24 of the two capacitor chips 20 are connected to the first connection surface 611, and the first terminal electrodes 22 of the two capacitor chips 20 are connected to the second connection surface 612.

Next, the end surfaces of the first terminal electrodes 22 in the Y-axis direction of the two capacitor chips 20 connected to the first connection surface 611 are faced with a rear surface of the first outer metal terminal 30, and the end surfaces of the second terminal electrodes 24 in the Y-axis direction of the two capacitor chips 20 connected to the second connection surface 612 are faced with the second outer metal terminal 40.

At this time, the connection member 50 (see FIG. 2), such as solder, is applied to the initial application regions 50c shown in FIG. 1A and FIG. 3A on the end surfaces of the first terminal electrodes 22 in the Y-axis direction of the two capacitor chips 20 connected to the first connection surface 611 or on the rear surface of the first outer metal terminal 30. Likewise, the connection member 50 (see FIG. 2), such as solder, is applied at positions corresponding to the initial application regions 50c shown in FIG. 1A and FIG. 3A on the end surfaces of the second terminal electrodes 24 in the Y-axis direction of the two capacitor chips 20 connected to the second connection surface 612 or on the rear surface of the second outer metal terminal 40.

After that, the joint region 50*a* is formed in such a manner that the connection member 50 applied on the initial application regions 50*c* spreads out by bringing a heating element into contact with the outer surface of the terminal body 36 (46) and pushing it against the end surface of the chip 20. The non-joint region 50*b* is a region where the connection member 50 is not spread out. Thus, the capacitor 10 is obtained by electrically and mechanically connecting the first outer metal terminal 30 to the first terminal electrode 22 and 22 of the two capacitor chips 20 connected to the first connection surface 611 of the intermediate metal terminal 60 and electrically and mechanically connecting the second outer terminal 40 to the second terminal electrodes 24 and 24 of the two capacitor chips 20 connected to the second connection surface 612 of the intermediate metal terminal 60.

Incidentally, each of the metal terminals 30, 40, and 60 is not necessarily connected to each of the capacitor chips 20 in the above-mentioned order and may be connected to each of the capacitor chips 20, for example, in reverse order. Instead, each of the metal terminals 30, 40, and 60 may simultaneously be connected to each of the capacitor chips 20.

In the capacitor 10 obtained as described above, a height direction (Z-axis direction) of the capacitor 10 is identical to directions of the chip first sides 20*g* (longer sides of the capacitor chips 20), and the mount portions 38 and 48 are formed by being bent from the terminal second side 36*hb* toward below the capacitor chips 20. Thus, the capacitor 10 has a small projected area in the height direction (Z-axis direction) of the capacitor 10 (see FIG. 4 and FIG. 5) and can have a small mount area.

In the capacitor 10, a plurality of capacitor chips 20 is arranged side by side in the parallel direction to the mount surface. In the capacitor 10, for example, only one capacitor chip 20 is held in the engagement direction (Z-axis direction) between a pair of engagement arm portions 31*a* and 31*b*. Thus, the capacitor 10 has a high connection reliability between each of the capacitor chips 20 and the outer metal terminals 30 and 40 and has a high reliability for impact and vibration.

Moreover, since a plurality of capacitor chips 20 is arranged and laminated in the parallel direction to the mount surface, the capacitor 10 has a short transmission path and can achieve a low ESL. Since the capacitor chips 20 are held perpendicularly to the lamination direction of the capacitor chips 20, the first and second outer metal terminals 30 and 40 can hold the capacitor chips 20 without any problems even if the length L2 of the chip second side 20*h* of the capacitor chips 20 varies due to change in the lamination number of capacitor chips 20 to be held. Since the first and second outer metal terminals 30 and 40 can hold the capacitor chips 20 having various lamination numbers, the capacitor 10 can flexibly respond to design change.

In the capacitor 10, the upper arm portions 31*a* and 33*a* and the lower arm portions 31*b* and 33*b* sandwich and hold the capacitor chips 20 from both ends of the chip first sides 20*g* (longer sides of the first end surfaces 20*a* of the capacitor chips 20). Thus, the first and second outer metal terminals 30 and 40 can effectively demonstrate a restraint effect on stress, prevent a transmission of vibration from the capacitor chips 20 to the mount board, and prevent an acoustic noise.

In particular, since the lower arm portion 31*b* (33*b*) is formed by being bent from a lower opening edge of the second through hole 36*c*, the lower arm portion 31*b* (33*b*) supporting the capacitor chip 20 and the terminal body 36 (46) supporting the lower arm portion 31*b* (33*b*) are elastically easily deformable. Thus, the first and second outer metal terminals 30 and 40 can effectively demonstrate a reduction effect on stress generated in the capacitor 10 and an absorption effect on vibrations.

Since the lower arm portions 31*b* and 33*b* are formed by being bent at the lower opening peripheries of the second through holes 36*c*, the lower arm portions 31*b* and 33*b* of the capacitor 10 can be arranged at overlapping positions with the mount portion 38 in the perpendicular direction (Z-axis direction) to the mount surface (see FIG. 2 and FIG. 5). Thus, the capacitor 10 can have a wide mount portion 38 and is advantageous for downsizing.

Since the first through holes 36*b* are formed, a connection state between the first and second outer metal terminals 30 and 40 and the chip capacitors 20 can easily be recognized from outside, and the ceramic capacitor 10 can thereby have a reduced quality dispersion and an improved non-defective product ratio.

In the capacitor 10 according to the present embodiment, a pair of engagement arm portions (holding pieces with elasticity) 31*a*, 31*b*, 33*a*, and 33*b* (the same applies to 41*a*, 41*b*, 43*a*, and 43*b*) of the outer metal terminal 30 (the same applies to the metal terminal 40) particularly sandwich and hold the chips 20 from both sides in the Z-axis direction. In addition, the connection member 50 (see FIG. 2), such as a solder, connects between the metal outer terminals 30 and 40 and the chips 20 within a predetermined range of the joint regions 50*a*, and the chips 20 and the metal outer terminals 30 and 40 can thereby be joined definitely and firmly.

The non-joint region 50*b*, which does not connect between the terminal body 36 (46) and the end surfaces of the terminal electrodes 22 (24), is formed between the peripheries of the joint regions 50*a* and the engagement arm portions 31*a*, 31*b*, 33*a*, and 33*b* (the same applies to 41*a*, 41*b*, 43*a*, and 43*b*). In the non-joint region 50*b*, the terminal body 36 (46) of the outer metal terminal 30 (40) can freely elastically be deformed without being disturbed by the terminal electrodes 22 (24), and stress is reduced. This favorably maintains an elastic property of the engagement arm portions 31*a*, 31*b*, 33*a*, and 33*b* (41*a*, 41*b*, 43*a*, and 43*b*) continuing to the non-joint region 50*b*, and the chips 20 can favorably be held between a pair of engagement arm portions 31*a* and 31*b* and between a pair of engagement arm portions 33*a* and 33*b*. In addition, the outer metal terminal 30 (40) is easily elastically deformed, and an acoustic noise phenomenon can be prevented effectively.

A total area of the non-joint region 50*b* is larger than $3/10$ of a total area of the joint regions 50*a* and is within a predetermined range between the terminal body 36 (46) and the end surfaces of the terminal electrodes 22 (24). This structure improves the effects of the present embodiment.

In the non-joint region 50*b*, a non-joint gap 50*d* being as thick as the connection member 50 is present between the terminal body 36 (46) and the end surface of the terminal electrode 22 (24). In the non-joint region 50*b*, the non-joint gap 50*d* between the terminal body 36 (46) and the end surface of the terminal electrode 22 (24) becomes larger toward the arm portions 31*a*, 31*b*, 33*a*, and 33*b* (41*a*, 41*b*, 43*a*, and 43*b*).

In the non-joint region 50*b*, the terminal body 36 (46) of the outer metal terminal 30 (40) can thereby freely elastically be deformed without being disturbed by the terminal electrode 22 (24), and stress is reduced. This favorably maintains an elastic property of the engagement arm portions 31*a*, 31*b*, 33*a*, and 33*b* (41*a*, 41*b*, 43*a*, and 43*b*) continuing to the non-joint region 50*b*, and the capacitor chips 20 can favorably be held by the arm portions. In addition, the outer metal terminal 30 (40) is easily elastically deformed, and an acoustic noise phenomenon can be prevented effectively.

Moreover, as shown in FIG. 3A, the end surfaces of the terminal electrodes 22 (24) of a plurality of chips 20 may be joined side by side with the terminal body 36 (46) in a plurality of joint regions 50a, and the non-joint region 50b is formed between the joint regions 50a adjacent to each other. In this structure, a pair of outer metal terminals 30 and 40 can easily connect a plurality of chips 20, and an acoustic noise phenomenon can be prevented due to the existence of the non-joint region 50b existing between the chips 20.

Moreover, in the present embodiment, the terminal body 36 (46) is provided with the second through holes 36c going through the front and back surfaces of the terminal body 36 (46) in the non-joint region 50b. The arm portions 31b and 33b (41b and 43b) extend from the opening peripheries of the second through holes 36c. Since the second through holes 36c are formed, the non-joint region 50b can be formed easily, the arm portions 31b and 33b (41b and 43b) can be formed easily, and the chips 20 are held firmly.

Moreover, in the present embodiment, the protrusions 36a protruding toward the end surface of the terminal electrode 22 (24) are formed on the inner surface of the terminal body 36 (46). This structure can easily control the joint region 50a of the connection member 50 and also easily control a thickness of the joint region 50a. In addition, this structure stabilizes the connection of the connection member even if the amount of the connection member is small.

In the present embodiment, vibrations do not travel from the chips 20 to the outer metal terminal 30 in the second through holes 36c. Although vibrations are easily generated by electrostrictive phenomenon in the chips 20, particularly in a part where the internal electrodes 26 of the chip 20 are laminated via the dielectric layers, vibrations can be prevented from traveling in the second through holes 36c in the present embodiment.

In the present embodiment, as shown in FIG. 2, the non-joint region 50b (the connection member 50 is not present between the terminal body 36 and the end surfaces of the terminal electrodes 22) is present in the non-opening region 36c1 of the terminal body 36 within a predetermined height L4 in the Z-axis direction corresponding to the second through holes 36c shown in FIG. 3A. In the non-joint region 50b, the terminal body 36 of the outer metal terminal 30 can freely elastically be deformed without being disturbed by the terminal electrodes 22, and stress is reduced. This favorably maintains an elastic property of the lower arm portions 31b and 33b as the holding pieces continuing to the non-opening regions 36c1, and the chips 20 can favorably be held by the lower arm portions 31b and 33b. In addition, the outer metal terminal 30 is easily elastically deformed, and an acoustic noise phenomenon can be prevented effectively.

Moreover, the lower arm portions 31b and 33b are formed in the second through holes 36c near the mount portion in the present embodiment. In this structure, electrostrictive strain vibrations of the internal electrodes 26 can be prevented from traveling to the outer metal terminal 30 near the mount portion 38. The lower arm portions 31b and 33b are hard to be influenced by the electrostrictive strain vibrations and can securely hold the chips 20.

In the present embodiment, the lower arm portion 31b (33b) is formed by being bent from an opening edge of the second through hole 36c. In this structure, the second through hole 36c and the lower arm portion 31b (33b) can easily be formed and arranged closely, and it is possible to more effectively prevent a vibration transmission from the chips 20 to the metal terminal 30 and a vibration transmission from the metal terminal 30 to the mount board.

In particular, as shown in FIG. 2, since the arm portions 31a and 31b and the arm portions 33a and 33b of the outer metal terminal 30 hold each of the capacitor chips 20, and since the outer metal terminal 30 and the capacitor chips 20 are connected in the joint regions 50a with a predetermined range by the connection member 50, such as solder, the capacitor chips 20 and the outer metal terminal 30 can securely and firmly be connected in the capacitor 10 according to the present embodiment.

As shown in FIG. 1B, the capacitor 10 according to the present embodiment includes the intermediate metal terminal 60. When the capacitor chips 20 are connected via the intermediate metal terminal 60, even if a substrate is deformed, vibrated, or the like after the capacitor 10 is mounted, a stress acting between each of the capacitor chips 20 is reduced. Thus, cracks are hard to be generated between each of the capacitor chips 20, and a joint reliability between each of the capacitor chips 20 can efficiently be secured.

In the present embodiment, the intermediate metal terminal 60 includes a plurality of engagement arm portions 63a to 63c and 64a to 64c for sandwiching and holding each of the capacitor chips 20. In this structure, the capacitor chips 20 are hard to fall off from the intermediate metal terminal 60, and a stress acting between each of the capacitor chips 20 is further reduced. Thus, a joint reliability between each of the capacitor chips 20 can effectively be secured.

In the present embodiment, the engagement arm portions 63a to 63c and 64a to 64c are arranged to be shifted so as not to overlap with each other when viewed from one end or the other end of the intermediate metal terminal 60 in the Z-axis direction. In this structure, a stress acting on the capacitor chips 20 is further reduced, and a joint reliability between each of the capacitor chips 20 can effectively be secured.

Second Embodiment

Figure 7A:
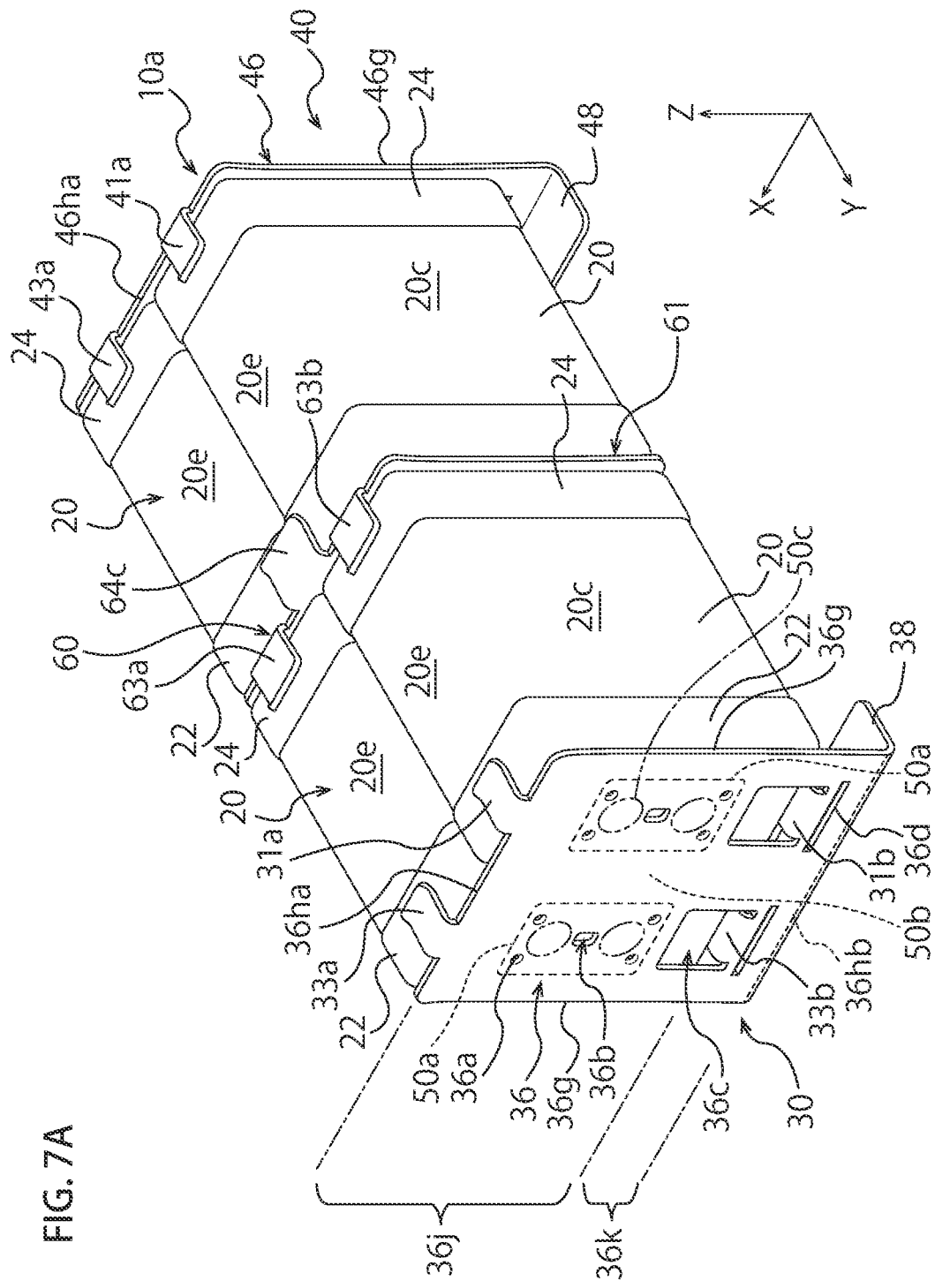
FIG. 7A is a schematic perspective view illustrating a ceramic electronic device according to another embodiment of the present invention.

FIG. 7A is a schematic perspective view of a capacitor 10a according to a variation of the capacitor 10 shown in FIG. 1A. In the outer metal terminal 30 of the capacitor 10a shown in FIG. 7A, a base of the upper arm portion 31a (a boundary between the arm portion 31a and the terminal body 36) among the pair of arm portions 31a and 31b (the same applies to the arm portions 33a and 33b/the same applies hereinafter) is narrower than the lower arm portion 31b.

In this structure, the pair of arm portions 31a and 31b stably holds the capacitor chip 20, and the capacitor chip 20 and the outer metal terminal 30 can securely and firmly be connected. Other structure of the present embodiment is similar to First Embodiment and demonstrates similar effects to First Embodiment.

In the capacitor 10a shown in FIG. 7A, the upper arm portion 31a (33a) is narrower than the lower arm portion 31b (33b) in the X-axis direction, but the upper arm portion 31a (33a) may be wider than the lower arm portion 31b (33b) in the X-axis direction.

Third Embodiment

Figure 7B:
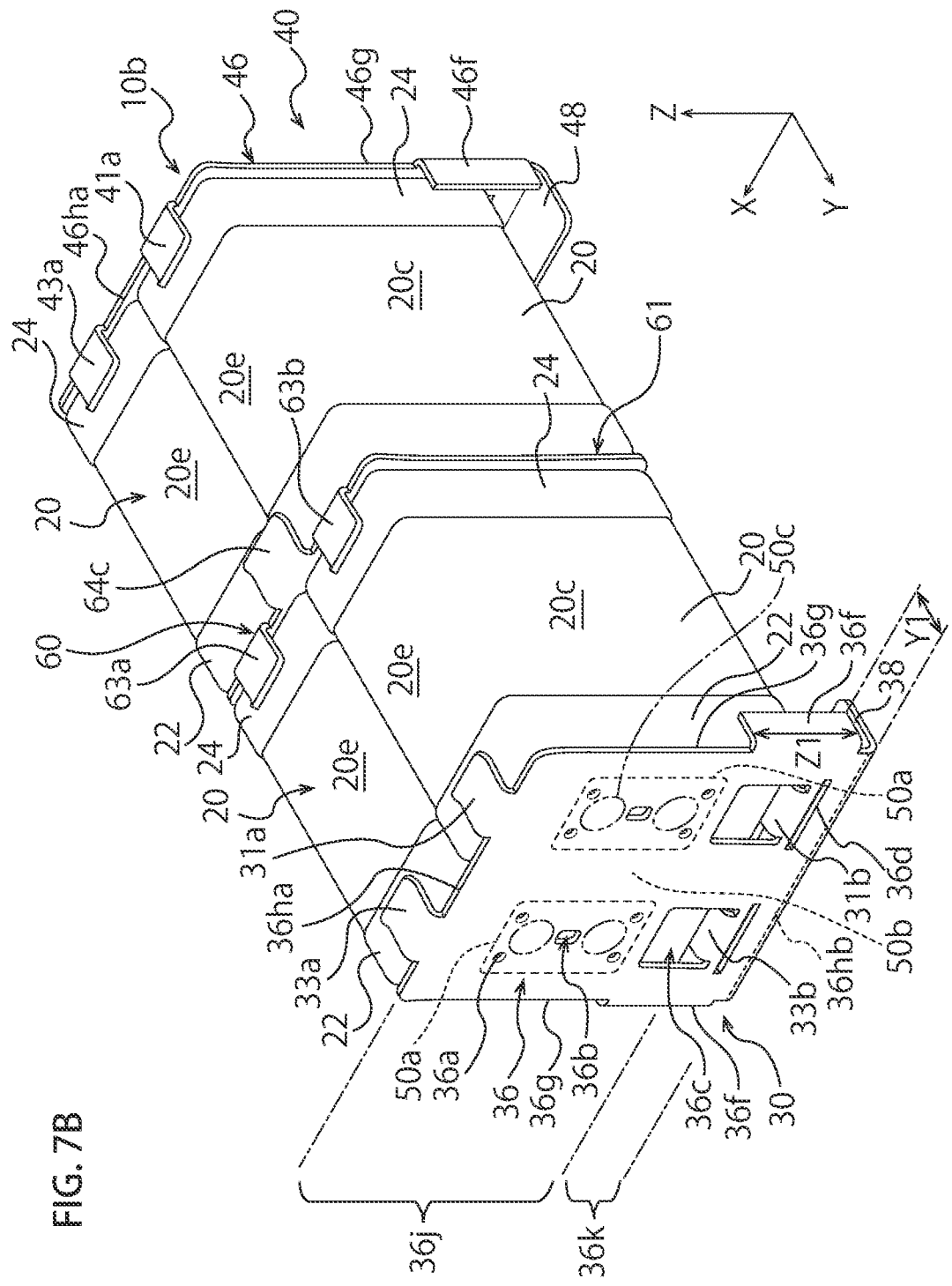
FIG. 7B is a schematic perspective view illustrating a ceramic electronic device according to further another embodiment of the present invention.

FIG. 7B is a schematic perspective view of a capacitor 10b according to a variation of the capacitor 10 shown in FIG. 1A. In the outer metal terminal 30 of the capacitor 10b shown in FIG. 7B, reinforcement pieces 36f are formed on the terminal body 36 in a lower position of the non-joint region 50b failing to overlap with the joint regions 50a in the Z-axis direction (the pair of engagement arm portions 31a and 31b faces each other (the same applies to 33a and 33b/no mention hereinafter)). The pair of reinforcement pieces 36f is bent inward from both sides of the terminal body 36 in the X-axis direction toward the capacitor chips 20 (Y-axis direction). The pair of reinforcement pieces 36f is formed on the terminal body 36 so as to face each other in the X-axis direction.

Each of the reinforcement pieces 36f has a length Z1 in the Z-axis direction determined to include at least the non-joint region 50b from the lower edge of the joint region 50a to the lower arm portion 31b. Preferably, the length Z1 is determined so as not to overlap with the joint region 50a and so as to overlap with a height L4 of the second through hole 36c in the Z-axis direction shown in FIG. 3A.

Preferably, each of the reinforcement pieces 36f shown in FIG. 7B has a length Z1 in the Z-axis direction determined to further overlap with a width of the slit 36d in the Z-axis direction shown in FIG. 3A. Moreover, each of the reinforcement pieces 36f shown in FIG. 7B preferably has a length Z1 in the Z-axis direction determined so as not to contact with the mount portion 38 and so as to maintain a predetermined gap Z2 between the reinforcement piece 36f and the mount portion 38. The gap Z2 is not limited, but is preferably 0.2 to 0.5 mm.

A length Y1 of each of the reinforcement pieces 36f from the terminal body 36 is not limited, but is determined, for example, based on a relation with a length Y2 of the mount portion 38 in the Y-axis direction (see FIG. 2). Preferably, Y1/Y2 is 0.2 to 0.6. Alternately, a length Y1 of each of the reinforcement pieces 36f from the terminal body 36 is determined based on a relation with a length Y3 of the engagement arm portion 31b in the Y-axis direction (see FIG. 2). Preferably, Y1/Y3 is 0.3 to 0.8.

Since the reinforcement pieces 36f are formed on the terminal body 36 in a lower position of the non-joint region 50b failing to overlap with the joint regions 50a in the Z-axis direction (the pair of engagement arm portions 31a and 31b faces each other (the same applies to 33a and 33b/no mention hereinafter)), the strength of the terminal body 36 is reinforced in the non-joint region 50b (no overlap with the joint regions 50a). Thus, the capacitor chip 20 is stably held by the pair of engagement arm portions 31a and 31b, and the capacitor chip 20 and the outer metal terminal 30 can securely and firmly be connected. Since a lower part of the non-joint region 50b, which is easily deformable, is reinforced, even if a substrate (not illustrated) is deformed while the capacitor 10 is mounted on the substrate, a strong connection between the capacitor chip 20 and the outer metal terminal 30 is maintained, and the outer metal terminal 30 or the capacitor chip 20 is not damaged very much.

Since the reinforcement pieces 36f are formed on the terminal body 36 in a lower part of the non-joint region 50b failing to overlap with the joint regions 50a, the non-joint gap 50d is easily secured and easily demonstrates advantages (e.g., prevention effect on acoustic noise), compared to when the reinforcement pieces 36f are formed to overlap with the joint regions 50a.

In the present embodiment, since the reinforcement pieces 36f are formed in pairs on both sides of the terminal body 36 in the X-axis direction as shown in FIG. 7B, the pair of arm portions 31a and 31b holds the capacitor chip 20 without being disturbed by the reinforcement pieces 36f.

Since the reinforcement pieces 36f are formed at a position where the terminal body 36 with the second through holes 36c and the slits 36d has a low strength, the strength at this position can favorably be maintained.

Since the reinforcement pieces 36f are not directly in contact with the mount portion 38, a solder can effectively be prevented from creeping up from the mount portion 38 (solder bridge). Incidentally, the reinforcement pieces 36f are indirectly connected with the mount portion 38 via the terminal body 36, and the reinforcement pieces 36f and the mount portion 38 are not directly in contact with each other.

The reinforcement pieces 36f overlap with the capacitor chips 20 in the Z-axis direction, but do not directly connect with the capacitor chips 20 due to the gap as shown in FIG. 7B. In this structure, vibrations from the capacitor chips 20 to the reinforcement pieces 36f can be prevented while the low profile of the capacitor 10 is achieved. Moreover, even if a substrate (not illustrated) is deformed after mounting, the reinforcement pieces 36f are also deformed in accordance with the deformation of the substrate, absorb it, and are not connected with the capacitor chips 20, and the capacitor chips 20 are not thereby damaged very much by the deformation of the substrate.

In the present embodiment, since the reinforcement pieces 36f are bent inward toward the capacitor chips 20, not away from the capacitor chips 20, the capacitor chips 20 can effectively be protected from impacts from outside while the capacitor 10 is downsized. Incidentally, the outer metal terminal 30 is mainly described in the above description, but the same applies to the outer metal terminal 40.

Fourth Embodiment

Figure 8:
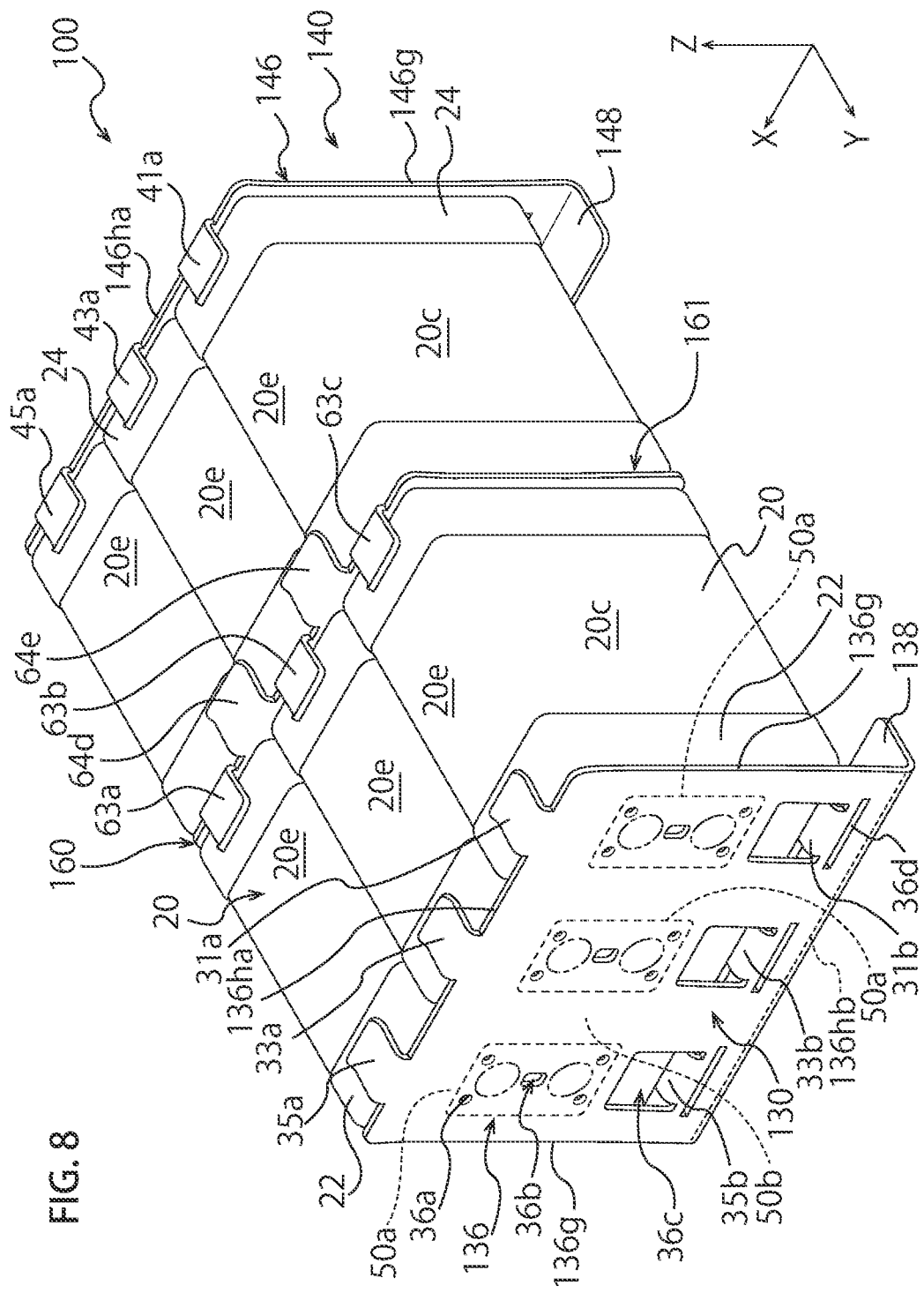
FIG. 8 is a schematic perspective view illustrating a ceramic electronic device according to further another embodiment of the present invention.

FIG. 8 is a schematic perspective view of a capacitor 100 according to another embodiment of the present invention. As shown in FIG. 8, the capacitor 100 is similar to the capacitor 10 according to First Embodiment or the capacitor 10a according to Second Embodiment except that the capacitor 100 has six capacitor chips 20 and has a different number of first through holes 36b, etc. contained in first and second metal terminals 130 and 140 and a different number of engagement arm portions 63a, 64a, etc. contained in an intermediate metal terminal 160. In the description of the capacitor 100, similar parts to the capacitor 10 or 10a are thereby provided with similar references to the capacitor 10 or 10a and are not described.

As shown in FIG. 8, the capacitor chips 20 contained in the capacitor 100 are similar to the capacitor chips 20 contained in the capacitor 10 shown in FIG. 1. The three capacitor chips 20 on one side in the Y-axis direction contained in the capacitor 100 are arranged in parallel to a mount surface so that the first terminal electrodes 22 of the adjacent capacitor chips 20 contact with each other, and that the second terminal electrodes 24 of the adjacent capacitor chips 20 contact with each other. The three capacitor chips 20 on the other side in the Y-axis direction contained in the capacitor 100 are arranged in parallel to a mount surface so that the first terminal electrodes 22 of the adjacent capacitor chips 20 contact with each other, and that the second terminal electrodes 24 of the adjacent capacitor chips 20 contact with each other.

The intermediate metal terminal 160 contained in the capacitor 100 has a connection portion 161. The engagement arm portions 63a, 63b, and 63c protruding toward one side in the Y-axis direction and the engagement arm portions 64d and 64e protruding toward the other side in the Y-axis direction are formed at the upper end of the connection portion 161. Each of the engagement arm portions 63a, 63b, and 63c is in contact with the single capacitor chip 20 on one side in the Y-axis direction. Each of the engagement arm portions 64d and 64e is in contact with both of the multiple (two) capacitor chips 20 on the other side in the Y-axis direction so as to cover them. The engagement arm portions 64d and 64e are formed to be wider than the engagement arm portions 63a, 63b, and 63c in the X-axis direction.

Although not illustrated in detail, the lower end of the connection portion 161 is provided with two engagement arm portions having similar structure to the engagement arm portions 64d and 64e and protruding toward one side in the Y-axis direction and three engagement arm portions having similar structure to the engagement arm portions 63a, 63b, and 63c and protruding toward the other side in the Y-axis direction.

The first metal terminal 130 contained in the capacitor 100 has a terminal body 136, three pairs of engagement arm portions 31a, 31b, 33a, 33b, 35a, and 35b, and a mount portion 138. The terminal body 136 faces the first terminal electrodes 22. The three pairs of engagement arm portions 31a, 31b, 33a, 33b, 35a, and 35b hold the capacitor chips 20. The mount portion 138 is bent perpendicularly from a terminal second side 136hb of the terminal body 136 toward the capacitor chips 20. The terminal body 136 has a substantially rectangular flat shape and has a pair of terminal first sides 136g approximately parallel to the chip first sides 20g and a pair of terminal second sides 136ha and 136hb approximately parallel to the chip second sides 20h.

As is the case with the first outer metal terminal 30 shown in FIG. 1A, the first outer metal terminal 130 is provided with the protrusions 36a, the first through holes 36b, the second through holes 36c, and the slits 36d. The first metal terminal 130 is, however, provided with three first through holes 36b, three second through holes 36c, and three slits 36d, and one first through hole 36b, one second through hole 36c, and one slit 36d correspond with one capacitor chip 20. The first metal terminal 130 is provided with 12 protrusions 36a in total, and the four protrusions 36a correspond with each of the capacitor chips 20.

In the first metal terminal 130, the upper arm portion 31a and the lower arm portion 31b hold one of the capacitor chips 20, the upper arm portion 33a and the lower arm portion 33b hold another one of the capacitor chips 20, and the upper arm portion 35a and the lower arm portion 35b hold another one of the capacitor chips 20 that is different from the above two capacitor chips 20. The upper arm portions 31a, 33a, and 35a are connected with the terminal second side 136ha at the upper part of the terminal body 136 (upper side in the Z-axis direction), and the lower arm portions 31b, 33b, and 35b are connected with periphery portions of the second through holes 36c.

The mount portion 138 of the first metal terminal 130 is connected with the terminal second side 136hb at the lower part of the terminal body 136 (negative side in the Z-axis direction). The mount portion 138 extends from the terminal second side 136hb toward the capacitor chips 20 (back in the Y-axis direction) and is bent approximately perpendicularly to the terminal body 136.

The second metal terminal 140 has a terminal body 146, a plurality of pairs of engagement arm portions 41a, 41b, 43a, 43b, 45a, and 45b, and a mount portion 148. The terminal body 146 faces the second terminal electrodes 24. The engagement arm portions 41a, 41b, 43a, 43b, 45a, and 45b sandwich and hold the capacitor chips 20 from both ends of the chip first sides 20g in the Z-axis direction. The mount portion 148 extends from the terminal body 146 toward the capacitor chips 20 and is at least partially approximately perpendicular to the terminal body 146.

As is the case with the terminal body 136 of the first metal terminal 130, the terminal body 146 of the second metal terminal 140 has a pair of terminal first sides 146g approximately parallel to the chip first sides 20b and a terminal second side 146ha approximately parallel to the chip second sides 20h, and the terminal body 146 is provided with the protrusions 46a, first through holes, second through holes, and slits. The second metal terminal 140 is arranged symmetrically to the first metal terminal 130 and is different from the first metal terminal 130 in arrangement to the capacitor chips 20. The second metal terminal 140 is, however, different from the first metal terminal 130 only in arrangement and has a similar shape to the first metal terminal 130. Thus, the second metal terminal 140 is not described in detail.

The capacitor 100 according to the present embodiment has similar effects to those of the capacitor 10 according to First Embodiment. Incidentally, each number of upper arm portions 31a to 35a, lower arm portions 31b to 35b, first through holes 36b, second through holes 36c, and slits 36d contained in the first metal terminal 130 of the capacitor 100 is the same as the number of capacitor chips 20 contained in the capacitor 100, but the number of engagement arm portions or so contained in the capacitor 100 is not limited thereto. For example, the first metal terminal 130 may be provided with twice as many first through holes 36b as the capacitor chips 20, or may be provided with a single long slit 36d continuing in the X-axis direction.

The number of capacitors 20 may be seven or more. In this case, the connection portion 161 of the intermediate metal terminal 160 has a width in the X-axis direction that is approximately equal to a length obtained by multiplying the number of capacitor chips 20 arranged on one side or the other side of the capacitor 10 in the Y-axis direction with a width of the capacitor chip 20 in the X-axis direction.

Fifth Embodiment

Figure 3B:
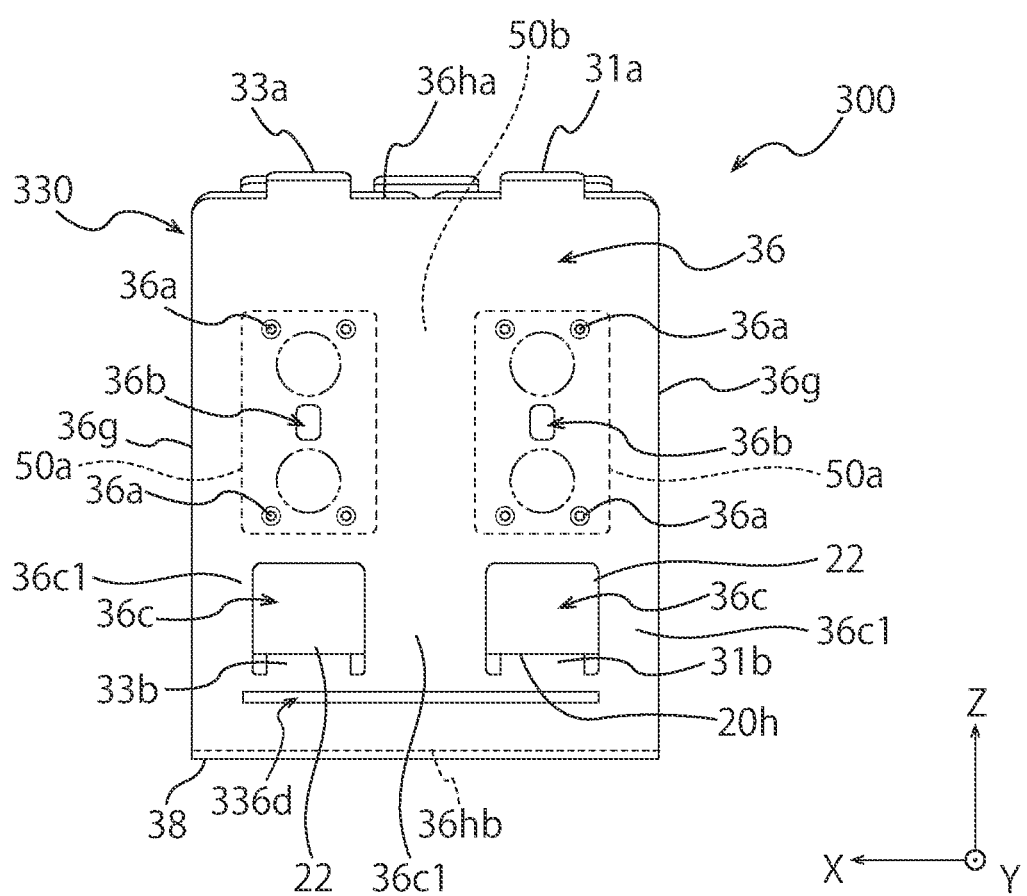
FIG. 3B is a left-side view of a ceramic electronic device according to a variation of the embodiment shown in FIG. 3A.

FIG. 3B is a left-side view illustrating a capacitor 300 according to another embodiment of the present invention. The capacitor 300 according to the present embodiment is similar to the capacitor 10 according to First Embodiment or the capacitor 10a according to Second Embodiment except for the shape of slits 336d formed on first and second metal terminals 330. As shown in FIG. 3B, the first and second metal terminals 330 are provided with a single slit 336d formed below the two second through holes 36c and continuing in the X-axis direction. The slit 336d has any shape and number as long as the slit 336d is formed between lower edges (chip second sides 20h) of the capacitor chips 20 facing the first end surfaces 20a and the terminal second side 36hb (i.e., terminal connection part 36k).

Sixth Embodiment

Figure 3C:
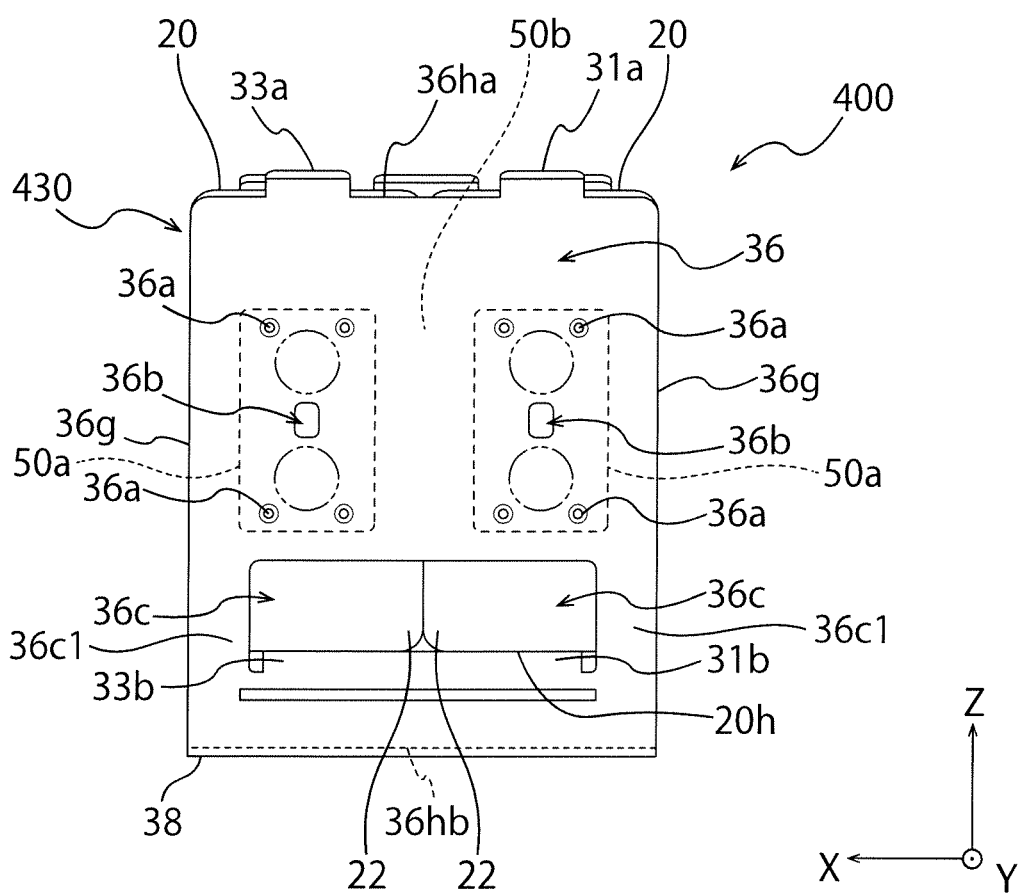
FIG. 3C is a left-side view of a ceramic electronic device according to another embodiment of the present invention.

FIG. 3C is a left-side view illustrating a capacitor 400 according to further another embodiment of the present invention. The capacitor 400 according to the present embodiment is similar to the capacitor 10 according to First Embodiment or the capacitor 10a according to Second Embodiment except for the shape of second through holes 36c formed on first and second metal terminals 430. As shown in FIG. 3C, one second through hole 36c continuing in the X-axis direction is formed in the first and second metal terminals 430. The second through hole 36c is formed in the terminal body 36 so that a part of the terminal electrodes 22 (part of lower portion) corresponding to the inner electrode layers 26 at the lower part (Z-axis direction) of the chips 20 adjacent to each other is exposed to the outside.

In the present embodiment, a width of the second through hole 36c in the X-axis direction is preferably smaller than a total width of the multiple chips 20 in the X-axis direction, and is preferably ⅙ to ⅚, more preferably ⅓ to ⅔, of a total width of the chips 20 in the X-axis direction.

Seventh Embodiment

Figure 3D:
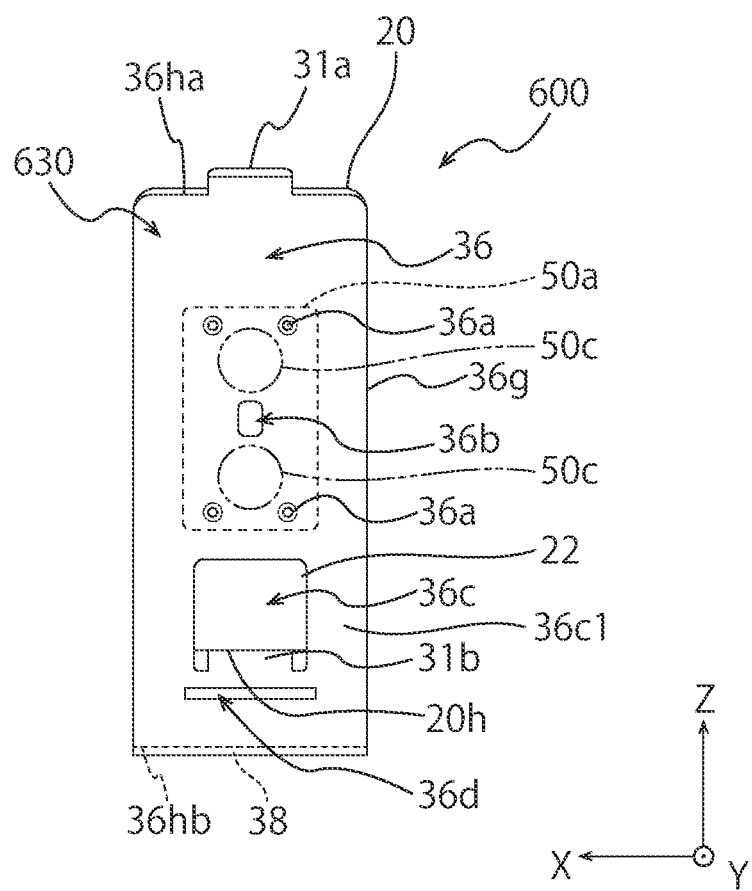
FIG. 3D is a left-side view of a ceramic electronic device according to further another embodiment of the present invention.

FIG. 3D is a left-side view illustrating a capacitor 600 according to further another embodiment of the present invention. The capacitor 600 according to the present embodiment is similar to the capacitor 10 according to First Embodiment or the capacitor 10a according to Second Embodiment except that two capacitor chips 20 are connected in series via an intermediate metal terminal (not illustrated) and are connected to first and second metal terminals 630. In the present embodiment, similar effects to First Embodiment and Second Embodiment are demonstrated.

OTHER EMBODIMENTS

Incidentally, the present invention is not limited to the above-mentioned embodiments, and may variously be changed within the scope of the present invention.

For example, the outer metal terminals 30, 130, 40, 140, 330, 430, and 630 are provided with the protrusions 36a, the first through hole 36b, and the slit 36d (or 336d) as necessary, but the metal terminal of the present invention is not limited to these metal terminals, and the electronic device of the present invention includes a variation where one or more of these components are not formed.

In the present invention, the number of chips owned by the electronic device is any plural. Moreover, for example, all of the arm portions 31a, 31b, 33a, and 33b shown in FIG. 1A are in contact with the first terminal electrode 22 of the capacitor chips 20 in First Embodiment, but not all of the arm portions 31a, 31b, 33a, and 33b need to be in contact with the first terminal electrode 22 after the joint regions 50a are formed. This is also the case with the other embodiments.

Moreover, for example, the reinforcement pieces 36f are formed so as not to overlap with the joint regions 50a in First Embodiment shown in FIG. 7B, but the upper end of the reinforcement piece 36f in the Z-axis direction may partially overlap with the joint region 50a. For example, each of the reinforcement pieces 36f has a length Z1 in the Z-axis direction determined so that a length of an overlapping region between the reinforcement piece 36f and the joint region 50a in the Z-axis direction is preferably 80% or less (more preferably 50% or less, still more preferably 30% or less) of a length of the joint region 50a in the Z-axis direction. This is also the case with the other embodiments mentioned above.

In First Embodiment mentioned above, as shown in FIG. 1C, engagement arm portions may be provided at both ends (ends on both sides) of the connection portion 61 in the X-axis direction. In an intermediate terminal 60a shown in FIG. 1C, an engagement arm portion 65a protruding toward one side in the Y-axis direction is formed at a side end of the connection portion 61 on one side in the X-axis direction (on the positive side in the X-axis direction), and an engagement arm portion 65b protruding toward one side in the Y-axis direction is formed at a side end of the connection portion 61 on the other side in the X-axis direction (on the negative side in the X-axis direction). The engagement arm portion 66a protruding toward the other side in the Y-axis direction is formed at one end of the connection portion 61 in the Z-axis direction, and the engagement arm portion 66b protruding toward the other side in the Y-axis direction is formed at the other end of the connection portion 61 in the Z-axis direction.

In this structure, two capacitor chips 20 connected to the first connection surface 611 of the connection portion 61 can laterally be sandwiched and held together by the engagement arm portions 65 and 65b.

In First Embodiment mentioned above, as shown in FIG. 1D, engagement arm portions may be provided at four corners of the connection portion 61. In an intermediate metal terminal 60b shown in FIG. 1D, an engagement arm portion 67a protruding toward one side in the Y-axis direction is formed at a corner between one side of the connection portion 61 in the X-axis direction and one side of the connection portion 61 in the Z-axis direction, an engagement arm portion 67b protruding toward one side in the Y-axis direction is formed at a corner between the other side of the connection portion 61 in the X-axis direction and the other side of the connection portion 61 in the Z-axis direction, an engagement arm portion 68a protruding toward the other side in the Y-axis direction is formed at a corner between one side of the connection portion 61 in the X-axis direction and the other side of the connection portion 61 in the Z-axis direction, and an engagement arm portion 68b protruding toward the other side in the Y-axis direction is formed at a corner between the other side of the connection portion 61 in the X-axis direction and one side of the connection portion 61 in the Z-axis direction. The engagement arm portions 67a, 67b, 68a, and 68b have an approximately L shape and are bent along each corner by about 90 degrees.

In this structure, two capacitor chips 20 connected to the first connection surface 611 of the connection portion 61 can be sandwiched and held together from lateral, above, and below by the engagement arm portions 67a and 67b, and two capacitor chips 20 connected to the second connection surface 612 of the connection portion 61 can be sandwiched and held together from lateral, above, and below by the engagement arm portions 68a and 68b.

In the above-mentioned embodiments, as shown in, for example, FIG. 1B, the engagement arm portions 63c, 64a, and 64b connected to the lower end of the connection portion 61 are in contact with the terminal electrodes 22 and 24 of each of the capacitor chips 20, but a gap in the Z-axis direction may be formed between the engagement arm portions 63c, 64a, and 64b and the terminal electrodes 22 and 24.

In the above-mentioned embodiments, the lower end of the connection portion 61 in the Z-axis direction may further be extended downward in the Z-axis direction so that the engagement arm portions 63c, 64a, and 64b shown in FIG. 1B can be connected to a mount board.

In the above-mentioned embodiments, the number of capacitor chips 20 connected to the first connection surface 611 of the intermediate metal terminal 60 may be different from the number of capacitor chips 20 connected to the second connection surface 612 of the intermediate metal terminal 60. For example, two capacitor chips 20 may be connected to the first connection surface 611, and one capacitor chip 20 may be connected to the second connection surface 612.

NUMERICAL REFERENCES 10, 10a, 100, 300, 400, 600 . . . capacitor
20 . . . capacitor chip
20a . . . first end surface
20b . . . second end surface
20c . . . first side surface
20d . . . second side surface
20e . . . third side surface
20f . . . fourth side surface
20g . . . chip first side
20h . . . chip second side
20j . . . chip third side
22 . . . first terminal electrode
24 . . . second terminal electrode
26 . . . internal electrode layer
28 . . . dielectric layer
30, 130, 40, 140, 330, 430, 530 . . . metal terminal
31a, 33a, 35a, 41a, 43a, 45a . . . upper arm portion (holding piece)
31b, 33b, 35b, 41b, 43b . . . lower arm portion (holding piece)
36, 136, 46, 146 . . . terminal body
36a, 46a . . . protrusion
36b . . . first through hole
36c . . . second through hole
36c1 . . . non-opening region
36d, 46d . . . slit
36f . . . reinforcement piece
36g . . . terminal first side
36ha, 36hb . . . terminal second side
38, 138, 48, 148 . . . mount portion
50 . . . connection member
50a . . . joint region
50b . . . non-joint region
50c . . . initial application region
50d . . . non-joint gap
60, 60a, 60b . . . intermediate metal terminal
61 . . . connection portion
611 . . . first connection surface
612 . . . second connection surface
63a, 63b, 63c, 64a, 64b, 64c, 64d, 64e, 65a, 65b, 66a, 66b, 67a, 67b, 68a, 68b . . . engagement arm portion

What is claimed is:

1. An electronic device comprising:
a plurality of chip components;
an intermediate metal terminal configured to connect end surfaces of terminal electrodes of the chip components; and
an outer metal terminal connectable to the terminal electrode positioned opposite to the terminal electrode connectable to the intermediate metal terminal,
wherein the intermediate metal terminal includes a first connection surface directed to one side in a first axis direction, a second connection surface directed to the other side in the first axis direction, and a plurality of holding pieces for sandwiching and holding the chip components,
the intermediate metal terminal is arranged so as to be sandwiched between a chip component connected to the first connection surface and a chip component connected to the second connection surface, and
the plurality of holding pieces include a first holding piece holding the chip component connected to the first connection surface and a second holding piece holding the chip component connected to the second connection surface.

2. The electronic device according to claim 1, wherein a terminal electrode of a chip component differing from the plurality of chip components is connected to one surface or the other surface of the intermediate metal terminal.

3. The electronic device according to claim 1, wherein the holding pieces are respectively formed on one end or the other end of the intermediate metal terminal and are arranged to be shifted so as not to overlap with each other when viewed from one end or the other end of the intermediate metal terminal.

4. The electronic device according to claim 2, wherein the holding pieces are respectively formed on one end or the other end of the intermediate metal terminal and are arranged to be shifted so as not to overlap with each other when viewed from one end or the other end of the intermediate metal terminal.

5. The electronic device according to claim 1, wherein each of the holding pieces is in contact with a single chip component or the plurality of chip components.

6. The electronic device according to claim 2, wherein each of the holding pieces is in contact with a single chip component or the plurality of chip components.

7. The electronic device according to claim 3, wherein each of the holding pieces is in contact with a single chip component or the plurality of chip components.

8. The electronic device according to claim 4, wherein each of the holding pieces is in contact with a single chip component or the plurality of chip components.

9. The electronic device according to claim 5, wherein the holding piece in contact with the plurality of chip components is wider than the holding piece in contact with the single chip component.

10. The electronic device according to claim 6, wherein the holding piece in contact with the plurality of chip components is wider than the holding piece in contact with the single chip component.

11. The electronic device according to claim 7, wherein the holding piece in contact with the plurality of chip components is wider than the holding piece in contact with the single chip component.

12. The electronic device according to claim 8, wherein the holding piece in contact with the plurality of chip components is wider than the holding piece in contact with the single chip component.

13. The electronic device according to claim 1, comprising a pair of outer metal terminals,
wherein each of the plurality of holding pieces protrudes toward one of the outer metal terminals or the other outer metal terminal.

14. The electronic device according to claim 3, comprising a pair of outer metal terminals,
wherein each of the plurality of holding pieces protrudes toward one of the outer metal terminals or the other outer metal terminal.

15. The electronic device according to claim 5, comprising a pair of outer metal terminals,
wherein each of the plurality of holding pieces protrudes toward one of the outer metal terminals or the other outer metal terminal.

16. The electronic device according to claim 9, comprising a pair of outer metal terminals,
wherein each of the plurality of holding pieces protrudes toward one of the outer metal terminals or the other outer metal terminal.

17. An electronic device comprising:
a plurality of chip components;

an intermediate metal terminal configured to connect end surfaces of terminal electrodes of the chip components; and an outer metal terminal connectable to the terminal electrode positioned opposite to the terminal electrode connectable to the intermediate metal terminal, wherein the intermediate metal terminal includes a plurality of holding pieces for sandwiching and holding the chip components, and the holding pieces are respectively formed on one end or the other end of the intermediate metal terminal and are arranged to be shifted so as not to overlap with each other when viewed from one end or the other end of the intermediate metal terminal.

18. An electronic device comprising:

a plurality of chip components;

an intermediate metal terminal configured to connect end surfaces of terminal electrodes of the chip components; and an outer metal terminal connectable to the terminal electrode positioned opposite to the terminal electrode connectable to the intermediate metal terminal, wherein the intermediate metal terminal includes a plurality of holding pieces for sandwiching and holding the chip components, each of the holding pieces is in contact with a single chip component or the plurality of chip components, the holding piece in contact with the plurality of chip components is wider than the holding piece in contact with the single chip component.

19. An electronic device comprising:

a plurality of chip components;

an intermediate metal terminal configured to connect end surfaces of terminal electrodes of the chip components; and an outer metal terminal connectable to the terminal electrode positioned opposite to the terminal electrode connectable to the intermediate metal terminal, wherein the intermediate metal terminal includes a plurality of holding pieces for sandwiching and holding the chip components, the plurality of holding pieces includes holding pieces in contact with a single chip component, and holding pieces in contact with multiple chip components.

* * * * *